United States Patent [19]
Ueshima et al.

[11] Patent Number: 5,745,001
[45] Date of Patent: Apr. 28, 1998

[54] ACTIVE FILTER CIRCUIT APPARATUS

[75] Inventors: Jun Ueshima, Tokyo; Katsunori Sato, Kanagawa; Yoshiyuki Takayanagi, Kanagawa; Hideki Hirose, Kanagawa, all of Japan

[73] Assignee: Sony Corporation, Tokyo, Japan

[21] Appl. No.: 807,000

[22] Filed: Feb. 26, 1997

Related U.S. Application Data

[63] Continuation of Ser. No. 584,882, Jan. 11, 1996, abandoned, which is a continuation of Ser. No. 202,370, Feb. 25, 1994, abandoned.

[30]       Foreign Application Priority Data

Feb. 26, 1993  [JP]  Japan .................................. 5-039030
Feb. 26, 1993  [JP]  Japan .................................. 5-039031
Feb. 26, 1993  [JP]  Japan .................................. 5-062635

[51] Int. Cl.$^6$ ............................... H03K 5/00; H03B 1/00
[52] U.S. Cl. ........................ 327/553; 327/552; 333/174
[58] Field of Search .................................. 331/107, 303, 331/306; 327/556, 552, 553, 7, 254, 255; 348/711, 735; 333/17.1, 174

[56]            References Cited

U.S. PATENT DOCUMENTS

| | | | |
|---|---|---|---|
| 3,761,829 | 9/1973 | Spauding | 327/107 |
| 4,159,526 | 6/1979 | Mosley, Jr. et al. | 327/107 |
| 4,302,738 | 11/1981 | Cabot et al. | 333/17.1 |
| 4,558,282 | 12/1985 | Lowenschuss | 327/105 |
| 5,206,606 | 4/1993 | Yamaguchi et al. | 330/254 |
| 5,227,743 | 7/1993 | Yamamoto | 333/17.1 |
| 5,317,216 | 5/1994 | Hosoya et al. | 330/306 |

FOREIGN PATENT DOCUMENTS 0467653   1/1992   European Pat. Off. ............... 330/303

*Primary Examiner*—Timothy P. Callahan
*Assistant Examiner*—Dinh Le
*Attorney, Agent, or Firm*—Hill, Steadman & Simpson

[57]            ABSTRACT

An active filter apparatus makes it possible for a filter adjusting circuit to require a small number of elements when the filter adjusting circuit is contained in an integrated circuit, to be not easily affected by variations in the characteristics of the elements which form the circuit, and to be capable of easily adjusting the frequency characteristics of the filter to be adjusted. A characteristics conversion device converts, on the basis of an input signal and an output signal of the filter, to a characteristics conversion signal whose amplitude when the adjustment is completed is considerably larger than that of the output signal. As a result, the amplification factor of the characteristics conversion device, necessary to detect a maximum or minimum value of a characteristics conversion signal, is considerably small. Therefore, it is possible to considerably decrease an offset error of the characteristics conversion device.

3 Claims, 12 Drawing Sheets

ACTIVE FILTER CIRCUIT APPARATUS

This is a continuation of application Ser. No. 08/584,882, filed Jan. 11, 1996, abandoned, which is a continuation of 08/202,370 filed Feb. 25, 1994, now abandoned.

BACKGROUND OF THE INVENTION

1. Field of the Invention

This invention relates to an active filter circuit apparatus, and more particularly, the present invention relates to an active filter circuit which is used to adjust the trap frequency and the cut off frequency of a filter and the like with high accuracy.

2. Description of the Related Art

In conventional filters, the trap frequency of a band elimination filter has been adjusted in the manner described below. For example, an input signal being the same frequency as that of a prescribed desired trap frequency is supplied to the band elimination filter. The signal passed through the band elimination filter is amplified approximately 100 times greater and taken to detect the peak voltage of this amplified signal. The peak voltage of this detected output signal is equal to the amplitude of the signal passed through the band elimination filter. When a peak voltage at which this peak voltage is detected reaches a preset threshold value or less, it is recognized that the trap frequency of the filter is equal to a preset value, thus the adjustment is completed.

In such a sound multiplex signal demodulation circuit including a low-pass filter and a deemphasis circuit, since the low-pass filter characteristic and deemphasis characteristics vary depending upon the construction conditions (absolute positions and relative values of elements) of a circuit, the overall filter characteristics are adjusted by adjusting the trap frequency. Also in this case, a signal passed through two filters is amplified for example, approximately 100 times greater and then its peak voltage is detected. At this time, the signal detected as the peak voltage is equal to an amplitude of the signal passed through these two filters. When this output voltage reaches a preset threshold value or less, it is recognized that the entire filter characteristic is equal to the preset value, thus adjustment is completed.

In the above-described method of adjusting the trap frequency, the amount of attenuation from the filter is directly measured. When the preset amount of attenuation by the filter reaches the level of the threshold value or less, the adjustment is terminated.

However, the amplitude of the signal detected by this method is small, because the signal is attenuated when passed through the filter. Therefore, the gain of an amplifier which amplifies the detected signal approximately as the threshold, must be increased approximately 100 times greater, as a result it creates a problem such that an offset error of the amplifier becomes large. When it is determined to reach the threshold value or less, a problem occurs, for example, the peak detected output when the adjustment is completed is relatively small and easily affected by variations in the characteristics of elements of the peak detecting circuit.

In the conventional case, to compensate for the above-described drawbacks, the output of the amplifier is passed through a low-pass filter to integrate, and a threshold value is set on the basis of this output so that the gain of the amplifier is made small, thereby the offset error of the amplifier is canceled. However, in this case, the time constant of the low-pass filter must be set as large as approximately several [ms]. Although, it is practically impossible to contain the low-pass filter due to the large time constant in an integrated circuit. Even if the filter can be contained therein, there is a disadvantage in that the number of pins are increased.

Next, a method of adjusting the active filter composed of a negative feedback control will be described.

Generally, a method for inputting a reference signal to a filter and performing a negative feedback a phase detected output of the output signal which is obtained on the basis of the input signal, is used to adjust a frequency $f_0$ of an active filter contained in an IC.

For example, in a video signal processing IC, a sub-carrier is often used as a reference signal.

FIG. 1 is a block diagram illustrating an example of a conventional automatic filter characteristic adjusting circuit which employs negative feedback control.

In FIG. 1, 1 denotes a 90° phase shifter; 2 denotes a reference filter formed of a band-pass filter (hereinafter referred to as "BPF") or the like; 3 denotes a multiplier serving as a phase comparator; 4 denotes a low-pass filter (hereinafter referred to as "LPF"); 5 denotes a voltage/current converter (hereinafter abbreviated as V/I); and 6 denotes an adjustable filter. Here, the reference filter 2 has a correspondence with the characteristic of the adjustable filter.

With such an arrangement, a reference signal S1 of a frequency $f_{SC}$ serves as a reference for automatic adjustment, the signal S1 generated by an unillustrated reference oscillator or the like, is input to the 90° phase shifter 1.

The 90° phase shifter 1 outputs two types of signals S2 and S3, the phase of the signal S2 being 0° different from that of the reference signal S1, and the phase of the signal S3 being 90° different from that of the reference signal S1.

In the two types of signals, the signal S2 (that is, whose phase is the same as that of reference signal S1) is input to one of the input terminals of the multiplier 3.

On the other hand, the signal S3 (that is, whose phase difference is 90° with respect to the reference signal S1) is input to the reference filter 2. An output signal of the reference filter 2 is input to the other terminal of the multiplier 3 with respect to the signal S2 being one of two input terminals.

The multiplier 3 multiplies the two input signals together the phases of which are compared to each other. A comparison resultant is output as a phase error to the LPF 4.

The LPF 4 cuts off high-order components of the input phase error. In this manner, the signal whose high-order components are cut off is input to the V/I 5, in which the signal thus input is converted from a voltage into a current.

The current I1 obtained from the V/I converter 5 is fed back to the reference filter 2, which is controlled so that the output phase of the reference filter 2 becomes 90° with respect to the reference signal S1.

That is, the frequency $f_0$ of the reference filter 2 is adjusted to the same accuracy as that of the reference signal S1, and the frequency $f_0$ of the adjustable filter 6 is also adjusted.

In a video signal processing IC or the like, there is a need to generate an arbitrary time τ. As a means for realizing this, a circuit is used for forming a ramp (RAMP) waveform by discharging a constant current to a capacitor and making use of the fact that the time needed before the ramp waveform reaches a certain voltage is constant.

However, when an attempt is made to generate an arbitrary time τ within an IC, it is difficult to obtain an accurate value because there are variations in the capacity of the IC of approximately±7% as a time τ.

Therefore, in the related art, when an accurate value is needed as a time τ, an externally provided capacitor is used instead of a capacitor provided in the IC, and a reference current having no variations in its temperature dependence characteristics and elements is generated to satisfy that need.

The conventional automatic filter characteristics adjusting circuit described above has a reference oscillator (not shown), the 90° phase shifter 1, the BPF 2, the multiplier (phase comparator) 3, the LPF 4, and V/I converter 5. And the filter adjusting circuit is structured as a block independent of other functions on the same IC. Thus, there are problems that the number of elements and power consumption increase.

Further, in the above-described conventional automatic filter characteristics adjusting circuit, the reference filter 2 and the adjustable filter 6 are easily affected by various variation factors, and therefore it is impossible to adjust the adjustable filter 6 with a high degree of accuracy.

In the video signal processing IC, there is a trap (TRAP) of a sub-carrier frequency $f_{SC}$ which requires accurate control of frequency $f_0$. However, in this case, as shown in FIG. 2 by the broken line, phase characteristics of the frequency $f_0$ to be controlled are noncontinuous about a frequency $f_{SC}$. Therefore, cannot be used as a reference filter.

Therefore, if other filters, i.e. LPF, BPF, HPF or an equalizer is used as the reference filter 2 to form an automatic adjusting circuit, the reference filter 2 will not necessarily be in a one-to-one correspondence with the adjustable filter 6 with respect to each variation factor, and the accuracy of the frequency $f_0$ of the trap which is an adjustable filter cannot be improved, this is a design problem.

The circuit for setting the arbitrary time τ has a disadvantage in that, for example, such a circuit requires a terminal for an external capacitor and a terminal for generating a reference current with no temperature characteristics.

The adjustment of frequency of the active filter has been described above, and a frequency conversion circuit also requires a similar adjustment.

A frequency conversion circuit is provided in the video signal processing IC, in which conventional frequency conversion circuits convert frequencies using only multipliers.

However, in the conventional frequency conversion circuit described above, a side band leak is generated because only the multipliers are employed.

SUMMARY OF THE INVENTION

In view of the foregoing, a first aspect of this invention is to provide a filter adjusting circuit which requires a small number of elements so that when it is contained in an integrated circuit, is not easily affected by variations in the characteristics of the elements which form the circuit, and is capable of easily adjusting the frequency characteristics of the filter.

Further, a second aspect of this invention is to provide an automatic filter adjusting circuit capable of adjusting the characteristic of an adjustable filter with a high degree of accuracy, and to provide a reference current generating circuit which makes it possible to reduce the number of IC terminals and elements, so as to generate an electric current proportional to an absolute variation and realize a circuit with high precision.

Furthermore, a third aspect of this invention is to provide an active filter, which is composed of a video signal processing circuit which is capable of reducing a consumed power and converting frequencies without generating side band leak.

The foregoing and other objects of the invention have been achieved by the provision of a filter adjusting circuit, comprising: characteristic conversion means for inputting an input signal and an output signal of a filter to be adjusted and for generating a characteristic conversion signal the characteristic of which is converted so as to be different from the characteristic of the output signal on the basis of the input signal and the output signal; and detecting means 5, for inputting the characteristic conversion signal S4, S11 and for generating a detected signal S5, S12 indicating the maximum or minimum value of the characteristic conversion signal S4, S11, the frequency characteristic of filter 1 or 10 being adjusted by adjusting the frequency characteristic of the characteristic conversion means 4, 14 on the basis of the detected signal S5, S12

According to this invention, the characteristic conversion means 4, 14 converts into a characteristic conversion signal S4, S11 an amplitude of which, when the adjustment is completed, is considerably larger than that of the output signal S2, S8 on the basis of the input signal S1 and the output signal S2, S9 of the filter 1, 10. As a result, the amplification factor of the characteristic conversion means 4, 14 necessary for the maximum or minimum value of the characteristic conversion signal S4, S11 to be detected by the detecting means 5, 15 is considerably reduced. Therefore, it is possible to considerably decrease the offset error of the characteristic conversion means 4, 14. As a result, a filter adjusting circuit 2, 12 which is not easily affected by variations in the characteristics of the elements which constitute the detecting means 5, 15 and is capable of easily adjusting the frequency characteristics of the filter 1, 10, 11 can be realized by using a small number of elements.

Further, an automatic filter adjusting circuit invention of this, comprising: a reference filter to which a reference signal is input; and a phase comparator for comparing the phase of a reference signal with a phase of a signal output from the reference filter, wherein a signal output from the phase comparator is fed back to the reference filter to maintain the reference frequency of the reference filter at a predetermined frequency, and a feedback signal is input to an adjustable filter to maintain the reference frequency of the adjustable filter at a predetermined frequency, the reference filter and the adjustable filter being formed of the same type of filters.

Further, a reference current generating circuit of this invention, comprising: a reference filter to which a reference signal is input; a circuit for comparing the phase of the reference filter with a phase of a signal output from the reference filter, and for feeding back the phase detected output current to the reference filter to maintain the reference frequency of the reference filter at a predetermined frequency; a current source for outputting the feedback current; a pair of output transistors, the emitters of which are connected to each other and the collectors of which serve as an output; a pair of input transistors having a base-emitter junction connected between the bases of these pair of output transistors and a given power supply; and a Gilbert amplifier in which the connection nodes of the emitters of the pair of output transistors are connected to the output of the current source.

According to the automatic filter adjusting circuit of this invention, a reference signal is input to the reference filter and the phase comparator. A signal output from the reference filter is input to the phase comparator.

In the phase comparator, the phase of the reference signal is compared with that of the signal output from the reference filter. The signal indicating the result of the comparison is fed back to the reference filter. As a result, the reference frequency of the reference filter is maintained at a predetermined frequency.

A feedback signal is input to the adjustable filter so that the reference frequency of the adjustable filter is maintained at a predetermined frequency.

At this time, since the reference filter and the adjustable filter are formed of the same type of filters, the same operation is performed for various variation factors, and the frequency of the two filters can be precisely adjusted at a predetermined frequency.

According to the automatic filter adjusting circuit of this invention, the transmission function of the adjustable filter comprising a band-pass filter and a computation circuit for subtracting a signal output from the band-pass filter from a signal input to the band-pass filter becomes the same as the transmission function of the trap.

Therefore, since the adjustable filter is formed of the above-described circuit and the automatic adjusting circuit of $f_0$ uses the same band-pass filter, an $f_{SC}$ trap which achieves stable $f_0$ can be realized.

According to the reference current generating circuit of this invention, a differential signal current flows through the base-emitter junction of a pair of input transistors of the Gilbert amplifier. As a result, a drop in the voltage, caused in the base-emitter junction, causes the base of the output transistor to be driven.

The current source is constructed similarly to the automatic filter adjusting circuit. The output current adjusted stably by feedback control is supplied to the emitters of a pair of output transistors. The output transistors function as a differential amplifier, and a current proportional to a capacity variation is output from its collector.

Further, a video signal processing circuit of this invention comprising: a video signal processing section which includes an oscillator which generates a reference signal of a predetermined frequency and a 90° phase converter which generates a signal which is obtained by shifting the reference signal of the oscillator and which signal processing section performs processing of video signals using the reference signal from the oscillator and a signal from the 90° phase converter; and an automatic filter adjusting section which includes a reference filter into which either a non-shifted of shifted signal in the 90° phase converter of the video signal processing section is input; and a phase comparator which compares the output signal from the reference filter with the other signal from the 90° phase converter, the automatic filter adjusting section feeding back the comparison result by the phase comparator to the reference filter and maintaining the reference frequency of the reference filter at a predetermined frequency.

Further, a video signal processing circuit of this invention comprising: a first phase converter which receives a reference signal to generate two signals which differ by 90° in phase; a second phase converter which receives a signal to be converted to generate two signals which differ by 90° in phase; a first multiplier which multiplies one signal generated by the first phase converter by one signal generated by the second phase converter; a second multiplier which multiplies the other signal generated by the first phase converter by the other signal generated by the second phase converter; and an adder which adds the output of the first multiplier to the output of the second multiplier.

Further, a video signal processing circuit of this invention comprising: a video signal processing section which includes an oscillator for generating a reference signal of a predetermined frequency and a 90° phase converter for generating four signals which differ from each other by phases of 90° and perform processing of video signals using the reference signal from the oscillator and the signal from the 90° phase converter; an automatic filter adjusting section which includes a reference filter into which either of two signals having a difference of 90° in the phase, of the four signals from the 90° phase converter of the video signal processing section is input, and a phase comparator which compares the phase of the output signal from the reference filter with that of the other signal from the 90° phase converter, the automatic filter adjusting section feeding back the comparison result by the phase comparator to the reference filter, maintaining the reference frequency of the reference filter at a predetermined frequency; and a frequency conversion section which includes first and second multipliers which multiply two signals having a difference of 180° in phase of the four signals from the 90° phase converter of the video signals processing section; and an adder which adds the output of the first multiplier with that of the second multiplier.

According to this invention, a reference signal of a predetermined frequency is generated by an oscillator of a video signal processing section and is output to a video signal processing system and a 90° phase converter.

In the 90° phase converter, two signals having phases shifted by 0° and 90° are obtained from an input reference signal and are output to an automatic filter adjusting section and a video signal processing system.

In the video signal processing system, a predetermined signal processing is performed according to the reference signal and the signal having a shifted phase.

In the automatic filter adjusting section, either of two input signals having phases shifted by 0° and 90° is input to the reference filter. An output signal of the reference filter is input to one input end of the phase comparator. Another signal which is output from the 90° phase converter is input to the other input end of the phase comparator.

In the phase comparator, the phases of the two input signals are compared, and as a result, a phase error is fed back to the reference filter. Consequently, the frequency of the reference filter is adjusted to the same degree of accuracy as the reference signal.

According to this invention, the reference signal is input to a first phase converter in a frequency conversion section. As a result, two signals which differ by 90° in phase are generated and are each output to first and second multipliers.

A signal to be converted is input to a second phase converter. As a result, two signals having a difference of 90° in phase are generated and are each output to the first and second multipliers.

In the first multiplier, one signal which is generated by the first phase converter is multiplied by one signal which is generated by the second phase converter and the result is output to an adder. In the same manner, in the second multiplier, the other signal which is generated by the first phase converter is multiplied by the other signal which is generated by the second phase converter, and the result is output to the adder.

In the adder, the output of the first multiplier is added to the output of the second multiplier and a signal having no unneccesary side band is output.

According to this invention, a reference signal of a predetermined frequency is generated by an oscillator of a video signal processing section and is output to a video signal processing system and a 90° phase converter.

In the 90° phase converter, four signals which differ from each other by phases of 90° are obtained from an input reference signal and are output to a video signal processing system. Of the four signals, two signal having a difference of 90° in phase are output to the automatic filter adjusting section. Of the four signals, two signals having a difference of 180° in phase are, as a pair, output to the frequency conversion section.

In the video signal processing system, a predetermined signal processing is performed according to the reference signal and a signal having a shifted phase.

In the automatic filter adjusting section, either of two input signals having a difference of 90° in phase is input to the reference filter. An output signal of the reference filter is input to one input end of a phase comparator. Another signal which is output from the 90° phase converter is input to the other input end of the phase comparator.

In the phase comparator, the phases of the two input signals are compared, and as a result, a phase error is fed back to the reference filter. Consequently, the frequency of the reference filter is adjusted to the same degree of accuracy as the reference signal.

In the frequency conversion section, two signals having a difference of 180° in phase are, as a pair, input to the first and second multipliers. The two signals which are input by the respective multipliers are multiplied and the result is output to an adder.

In the adder, an output of the first multiplier is added to an output of the second multiplier and a signal having no side band, which is not necessary, is output.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
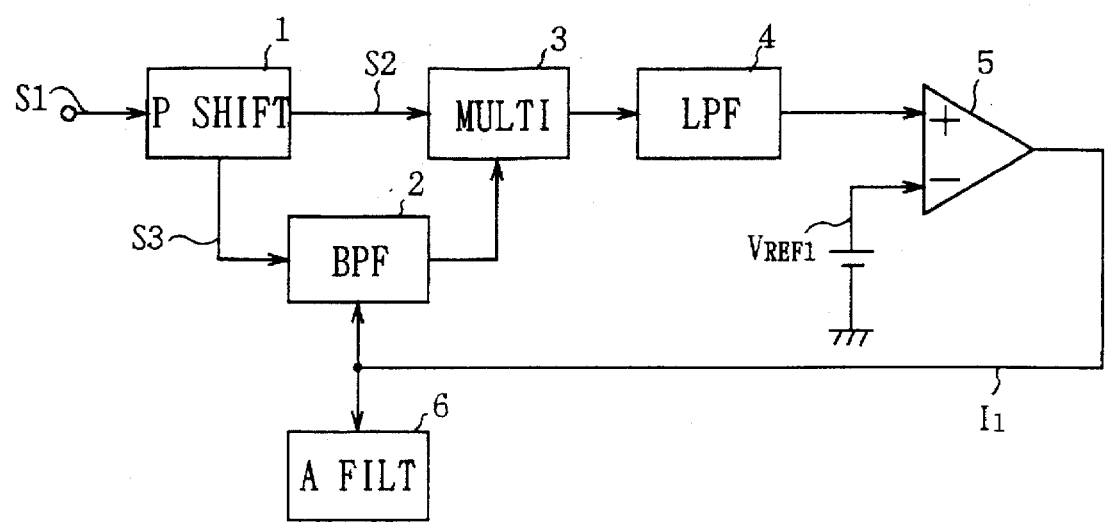
FIG. 1 is a block diagram showing the construction of a conventional filter characteristic auto-adjusting circuit.
Figure 2:
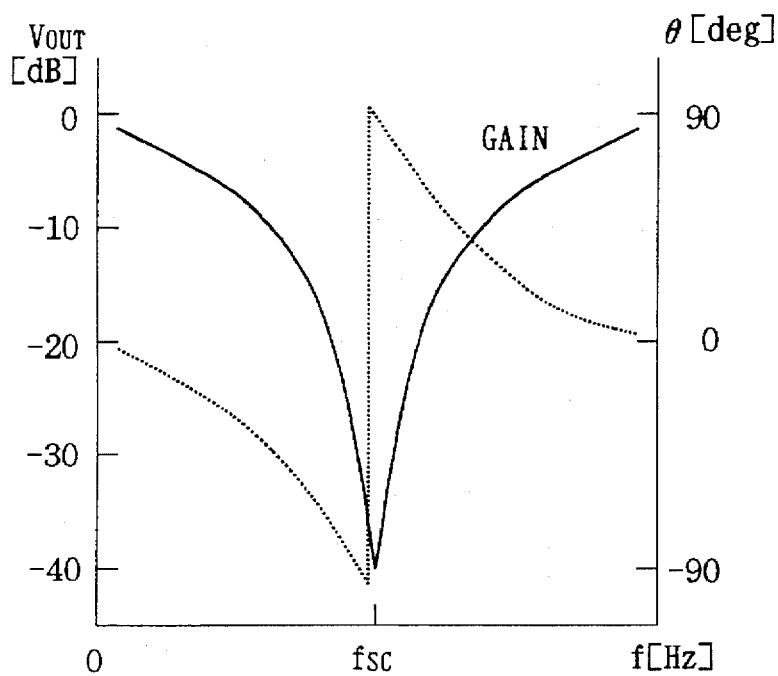
FIG. 2 is a schematic diagram illustrating electric characteristics of the filter characteristic auto-adjusting circuit shown in FIG. 1.
Figure 3:
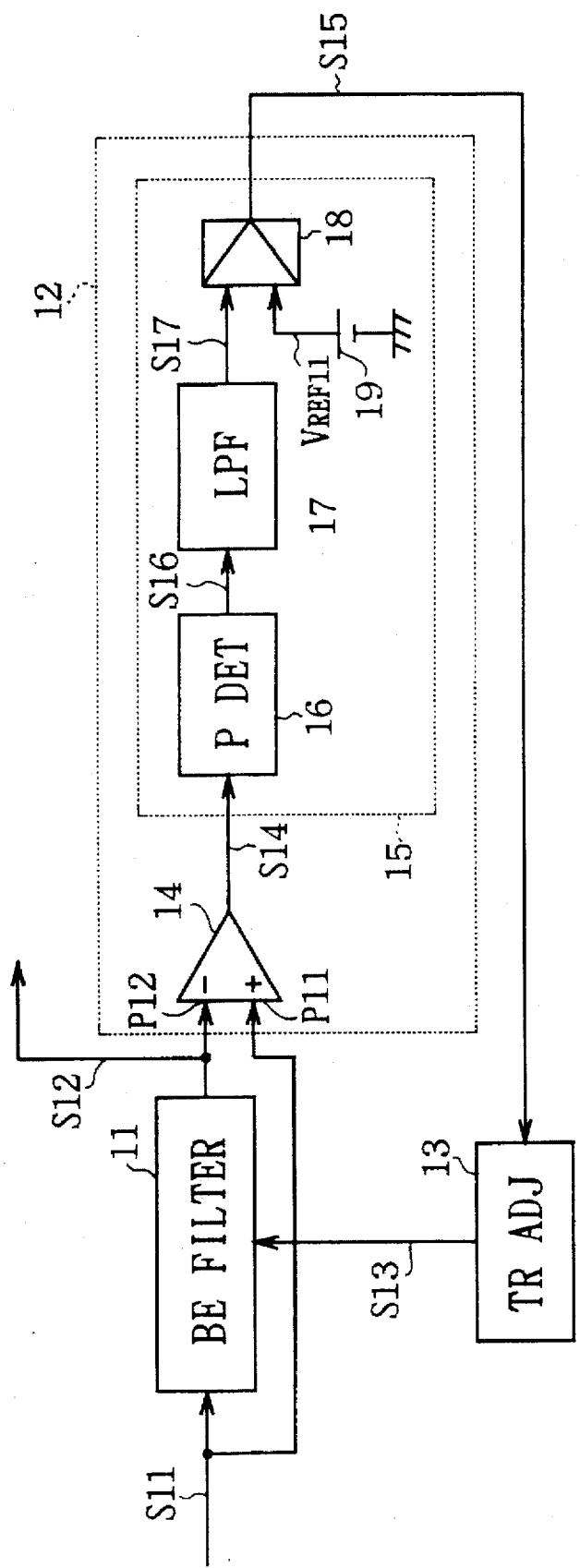
FIG. 3 is a block diagram showing the general construction of a first embodiment of a filter characteristic adjusting circuit according to this invention.
Figure 4:
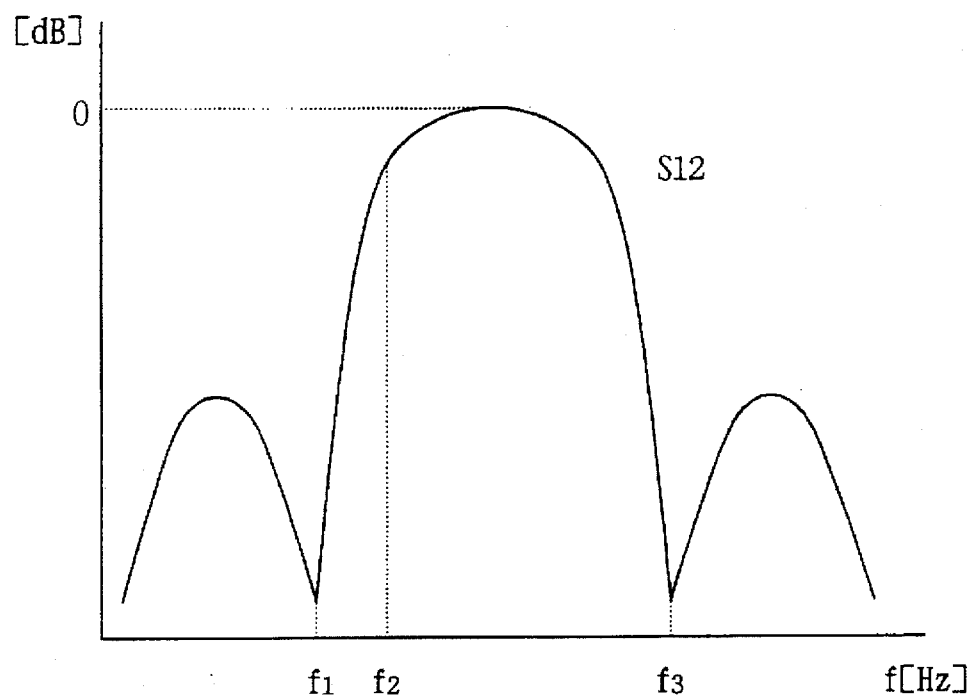
FIG. 4 is a characteristic curve linear diagram explaining the frequency characteristics of a filter to be adjusted in the first embodiment.

The first embodiment of this invention will be described with reference to the accompanying drawings:

In FIG. 3, a band elimination filter 11 to be adjusted, together with a trap point detecting circuit 12, is contained in an integrated circuit. The frequency characteristic curve of the band elimination filter 11 will be shown as FIG. 4. This frequency characteristic curve forms a first trap point at frequency $f_1$, the amount of the attenuation is small at the frequency $f_2$, which is slightly higher than the frequency $f_1$, and then forms a second trap point at frequency $f_3$, which is higher than the frequency $f_2$. The band elimination filter 11 provides an output signal S12 which is an attenuated form of an input signal S11 in accordance with the frequency characteristic curve, to the trap point detecting circuit 12. The current value of a current source consisting of the band elimination filter 11 is adjusted in accordance with an adjustment signal S13 supplied from a trap characteristic adjusting circuit 13. Corresponding to this adjustment of the current value, frequencies $f_1$, $f_2$, and $f_3$ which determine the frequency characteristic curve are adjusted at the same time.

Figure 5:
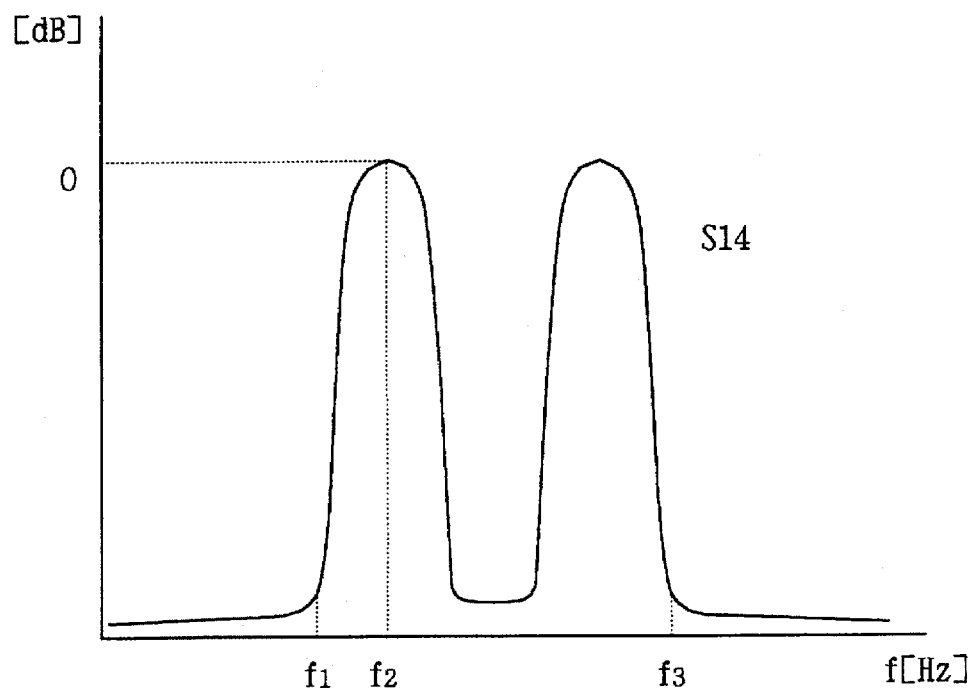
FIG. 5 is a characteristic curve linear diagram explaining the frequency characteristics of a computation signal in the first embodiment.

The trap point detecting circuit 12 inputs the input signal S11 and output signal S12 to a subtracter 14, and then a computation signal S14 of the frequency characteristic curve shown in FIG. 5 is generated on the basis of the input signal S11 and output signal S12. Here, since the computation signal S14 of which the amount of attenuation is large at frequencies $f_1$ and $f_3$, a first peak point of 0 [dB] is formed at frequency $f_2$, and a second peak point of 0 [dB] is formed at frequency $f_3$.

By adjusting the frequency $f_2$ given the peak point of the computation signal S14 to a desired frequency, the trap point detecting circuit 12 compares the amplitude of the computation signal S14 with a predetermined threshold value, as a result, when the amplitude of the computation signal S14 exceeds a predetermined threshold value, the "L" level comparison signal S15 is supplied to the trap characteristics adjusting circuit 13, and terminates the adjustment. Thereby, the trap frequencies $f_1$ and $f_3$ of the band elimination filter 11 are set at desired frequencies.

Next, the configuration of the trap point detecting circuit 12 will be described.

The trap point detecting circuit 12 is formed of the subtracter 14 and a comparison circuit section 15. The input signal S11 which is set to a predetermined frequency and a predetermined amplitude previously, is input to the band elimination filter 11 and a non-inversion input terminal P11 of the subtracter 14. The output signal S12 of the band elimination filter 11 is input to an inversion input terminal P12 of the subtracter 14. The subtracter 14 subtracts the output signal S12 from the input signal S11, as well as amplifying it by an amplification factor of 10 times or less, and then generates a computation signal S14 in which the amplitude of the predetermined frequency is attenuated in accordance with the frequency characteristic curve of FIG. 5. Thereafter, the subtracter 14 outputs the computation signal S14 to the comparison circuit section 15.

As described above, the band elimination filter 11 and the subtracter 14 operate as a band-pass filter for outputting the computation signal S14 such that the frequency characteristic of the band elimination filter 11 have been converted into nearly inverted frequency characteristic.

When the trap frequencies $f_1$ and $f_3$ of the band elimination filter 11 are adjusted by the trap characteristic adjusting circuit 13, because the output of the band-pass filter formed of the subtracter 14 and the band elimination filter 11, i.e., the computation signal S14 is obtained by the computation of the input signal S11 and the output signal S12, the frequency $f_2$ of the peak point is adjusted in the same direction as the adjustment in accordance with the adjustment of the frequency $f_1$ of the trap point.

As a result, adjusting the frequency $f_2$ of the peak point becomes equivalent to adjusting the frequency $f_1$ of the peak point. Here, the trap frequency $f_1$ is adjusted so that 4×horizontal synchronization frequency (hereinafter referred to as "$f_H$")=63 [KHZ], and the trap frequency $f_3$ is adjusted so that $6 \times f_H$=94.5 [KHz].

The circuit configuration of the comparison circuit section 15 will be described below.

The comparison circuit section 15 inputs the computation signal S14 to a peak detecting circuit 16, to detect the maximum voltage by measuring the amplitude of the computation signal S14. The peak detecting circuit 16 supplies the peak signal S16 indicating the maximum voltage to a low-pass filter 17 in order to remove the ripple components, which inputs a shaped peak signal S17 to a comparator 18.

The comparator 18 outputs the logic "L" level comparison signal S15 when the voltage of the shaped peak signal S17 is higher than the threshold value $V_{REF11}$ of a reference voltage source 19. When the voltage of the shaped peak signal S17 is lower than the threshold value $V_{REF11}$, the comparator 18 outputs the logic "H" level comparison signal S15.

The trap characteristic adjusting circuit 13 is provided with a logic circuit for inputting the comparison signal S15 and supplies the adjustment signal S13 to the band elimination filter 11 in accordance with a predetermined sequence. When the logic "H" level comparison signal S15 is input to the trap characteristic adjusting circuit 13, the adjustment is terminated.

Next, an example of circuit of the trap point detecting circuit will be described.

Figure 6:
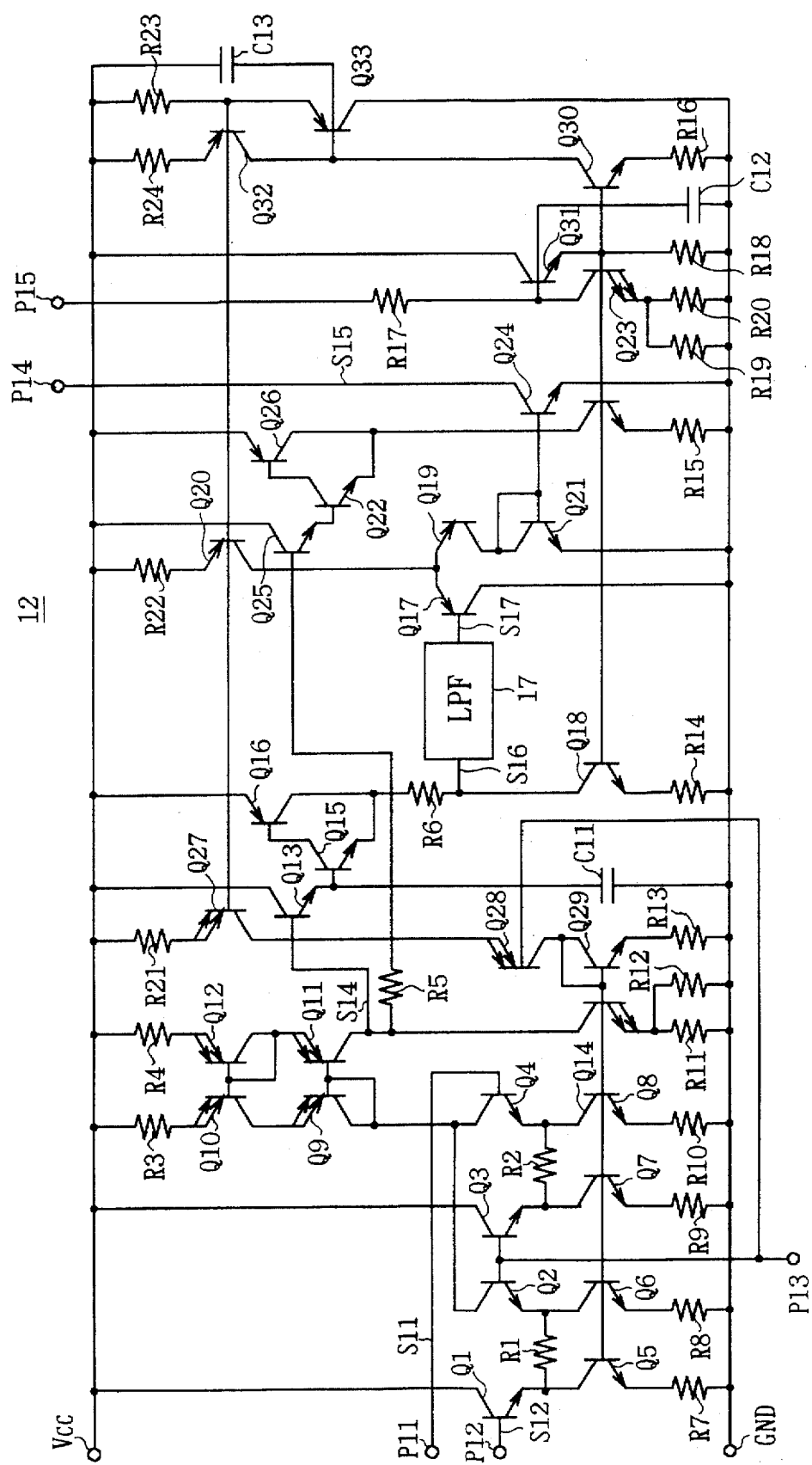
FIG. 6 is a schematic diagram illustrating the trap point detecting circuit in the first embodiment.

In FIG. 6, transistors Q1 and Q2 constitute one of the differential pair of the subtracter 14, and transistors Q3 and Q4 constitute the other differential pair thereof. In transistors Q1 and Q2 consisting one of the differential pair, emitters thereof are connected to each other via a resistor R1 for expanding the dynamic range, and the emitters are connected to collectors of transistors Q5 and Q6 consisting a current source, respectively.

The base of the transistor Q1 is connected to the input terminal P12, and the collector is connected to the power supply voltage Vcc. The base of the transistor Q2 is connected to the base of the transistor Q3 and to a bias input terminal P13 so that a predetermined constant voltage is supplied thereto, and the collector thereof is connected to the collector of the transistor Q4.

The input terminal P12 is supplied the output signal S12 from the band elimination filter 11. When supplying the output signal S12 to the input terminal P12, the output signal S12 is converted into a current and amplified by the transistors Q1 and Q2 constituting a differential pair. As a result, the phase of the collector current of the transistor Q2 is reverse to the phase of the output signal S12, this current being loaded from the collector of the transistor Q4.

Also in the transistors Q3 and Q4 constituting the other differential pair, the emitters thereof are connected to each other via a resistor R2 for expanding the dynamic range, and the emitters are connected to the collectors of the transistors Q7 and Q8 of the circuit source, respectively. The base of the transistor Q4 is connected to the input terminal P11. The collector of the transistor Q3 is connected to the power supply voltage VCC. The collector of the transistor Q4 is connected to the collector of the transistor Q9 constituting a current mirror type current source.

Here, when the input signal S11 is supplied to the input terminal P11, the input signal S11 is converted into a current and amplified by the differential pair of transistors Q3 and Q4, respectively. As a result, the phase of the collector current of the transistor Q4 is the same phase as that of the input signal S11. A current which has been added together the current having the same phase as that of the input signal S11 and the current having the phase the reverse of that of the output signal S12 loaded to the transistor Q2, flows through the collector of the transistor Q4.

Transistors Q9 to Q12 and resistors R3 and R4 constitute a current mirror type current source, and a current value which is the same as the current flowing through the collector of the transistor Q9 flows through the collector of the transistor Q11. The collector of the transistor Q11 is connected to the node of the base of the transistor Q13 which constitutes the trap point detecting circuit 16, and a resistor R5, and to the collector of the transistor Q14 of the current source.

As a result, the signal current which appears in the collector of the transistor Q9, that is, the signal current which is the same as the sum of the current having the same phase as that of the input signal S11 and the current having the phase the reverse of that of the output signal S12, appears in the collector of the transistor Q11. Since this signal current is supplied to one end of the resistor R5, a voltage used the bias voltage supplied to the node of the transistor Q13 and the resistor R5, and the other end of the resistor R5 as the center, is generated, and then the signal current is supplied to the base of the transistor Q13 as the computation signal S14. The frequency characteristic, when the signal current is converted into the computation signal S14, are as shown in FIG. 5.

The collector of the transistor Q13 of the peak detecting circuit 16 is connected to the power supply voltage Vcc, and the emitter thereof is connected to the base of the transistor Q15, the emitter being connected to the ground line GND via the capacitor C11.

As a result, when the amplitude of the computation signal S14 increases so that its voltage becomes higher than that of the capacitor C11, the current flows to the transistor Q13 to charge the capacitor C11 up to the level of voltage at that time. When the amplitude of the computation signal S14 decreases so that its voltage becomes lower than that of the capacitor C11, the transistor Q13 is reversely biased by the voltage of the capacitor C11 to stop charging, the voltage of the capacitor C11 at this time being maintained.

The transistors Q15 and Q16 constitute a buffer circuit for an output of the transistor Q13. The collector of the transistor Q15 is connected to the base of the transistor Q16, and the emitter thereof is connected to the collector of the transistor Q16 and one end of the resistor R6. The emitter of the transistor Q16 is connected to the power supply voltage Vcc. The other end of the resistor R6 is connected via the low-pass filter 17 to the base of the transistor Q17 of the comparator 18 and to the collector of the transistor Q18 of the circuit source.

As a result, the voltage of the capacitor C11 is converted into a current and amplified by the transistor Q15, the level of the current being shifted by the resistor R6 to become the peak signal S16. Then, the current is supplied to the low-pass filter 17 where ripple components are removed therefrom, and then supplied to the base of the transistor Q17 as the filter shaped peak signal S17.

The transistors Q17 and Q19 constitute a differential pair of transistors of the comparator 18. The emitter of the transistor Q17 is connected to the emitter of the transistor Q19 and to the collector of the transistor Q20 constituting the current source, and the collector of the transistor Q17 is connected to the ground line GND. On the other hand, the collector of the transistor Q19 is connected to the collector of the transistor Q21 constituting the current source, and the base thereof is connected between the emitter of the transistor Q22 and the collector of the transistor Q23 constituting the current source.

As a result, the base of the transistor Q19 is supplied with a voltage corresponding to the reference voltage $V_{REF11}$ of FIG. 3, and when the voltage of the shaped peak signal S17 is lower than the base voltage of the transistor Q19, the transistor Q19 is turned off. When, however, the voltage of the shaped peak signal S17 is higher than the base voltage of the transistor Q19, the transistor Q19 is turned on.

The transistor Q21 to which a diode is connected, together with the transistor Q24, constitutes a current mirror type current source. The base of the transistor Q21 is connected to the base of the transistor Q24, and the emitter thereof is connected to the ground line GND. The collector of the transistor Q24 is connected to an output terminal P14, and the emitter thereof is connected to the ground line GND.

As a result, the transistors Q21 and Q24 flow the current the value being the same value when the transistor Q19 is turned on, and they output the logic "L" level comparison signal S15 from the output terminal P14. When, however, the transistor Q19 is turned off, the transistors Q21 and Q24 are turned off, and they output the logic "H" level comparison signal S15 from the output terminal P14.

The base of the transistor Q25 is connected to the other end of the resistor R5, the emitter thereof is connected to the base of the transistor Q22, and the collector thereof is connected to the power supply voltage Vcc. The emitter of the transistor Q22 is connected to the collector of the transistor Q26, and the collector thereof is connected to the base of the transistor Q26. The emitter of the transistor Q26 is connected to the power supply voltage Vcc.

As a result, since the transistors Q25, Q22, and Q26 are connected in the same way as the transistors Q13, Q15, and Q16, the transistors Q25, Q22, and Q26 compensate for the temperature characteristics of the transistors Q13, Q15, and Q16. The other end of the resistor R5 is connected to the connection node of the collector of a transistor Q27 of the current source and the emitter of a transistor Q28 of the current source, so that a predetermined bias voltage is supplied to the base of the transistor Q25 from this connection node of the above collector.

In the above-described construction, the operation of the general configuration shown in FIG. 3 will be described. The frequency and amplitude of the input signal S11 and the reference voltage $V_{REF11}$ of the comparator 18 are determined beforehand so that when the frequency characteristic of the band elimination filter 11 reach the desired one, the shaped peak signal S17 is attenuated, and the comparator 18 outputs the comparison signal S15 which falls to the logic "L" level.

When the input signal S11 of the predetermined frequency and the predetermined amplitude is input to the input terminal P11 of the subtracter 14 and the output signal S12 is input to the input terminal P12, the input signal S11 and the output signal S12 are converted into currents, respectively, and amplified. At this time, the difference of the current between the input signal S11 and the output signal S12 appears in the collector of the transistor Q4. This current difference is again converted into a voltage by the resistor R5 to become the computation signal S14 and then supplied to the transistor Q13 of the peak detecting circuit 16.

The amplitude of the computation signal S14 is greatly attenuated by the output signal S12 when the set value of the adjustment is not a desired value. The more the trap characteristic adjusting circuit 13 adjusts the band elimination filter 11 toward a target frequency, the more the amplitude increases. Therefore, the electrical potential of the base of the transistor Q13 supplied with the computation signal S14 which gradually increases becomes higher than the electrical potential of the capacitor C11 and charges the capacitor C11 to an even higher peak electrical potential.

When the electrical potential of the capacitor C11 increases, the voltage of the peak signal S16 the level of which has been shifted by the resistor R6 increases also, and the shaped peak signal S17 of a voltage higher than the electrical potential is supplied to the base of the transistor Q17 of the comparator 18.

When in due time the amplitude of the computation signal S14 reaches a predetermined voltage or above, the transistor Q17 is turned off, succeedingly, the transistor Q19 is turned on, and the transistor Q24 is turned on. As a result, the logic "L" level comparison signal S15 is supplied to the trap characteristic adjusting circuit 13 from the output terminal P14, the trap characteristic adjusting circuit 13 terminates the adjustment, the frequencies $f_1$ and $f_3$ of the trap point being set at desired frequencies in the band elimination filter 11.

With the above-described arrangement, since the peak point of the computation signal S14 which has been converted so that the output amplitude when the adjustment is completed can be set large is detected instead of the output signal S12 the output amplitude of which when the adjustment is completed is small, it is possible to set the amplification factor of the subtracter 14 considerably low. Therefore, since the offset error of the subtracter 14 is considerably low enough to be ignored, influences due to variations in the characteristics of the elements of the comparison circuit section 15 can be reduced.

Since the offset error of the subtracter 14 is considerably small, it is possible to form the low-pass filter 17 by using a small number of elements. In addition, since the amplitude of the peak point of the computation signal S14 when the adjustment is completed is considerably larger than the amplitude at the trap point of the output signal S12, it is possible to easily set the threshold value of the comparator 18.

Nextly, the second embodiment of this invention will be described.

Figure 7:
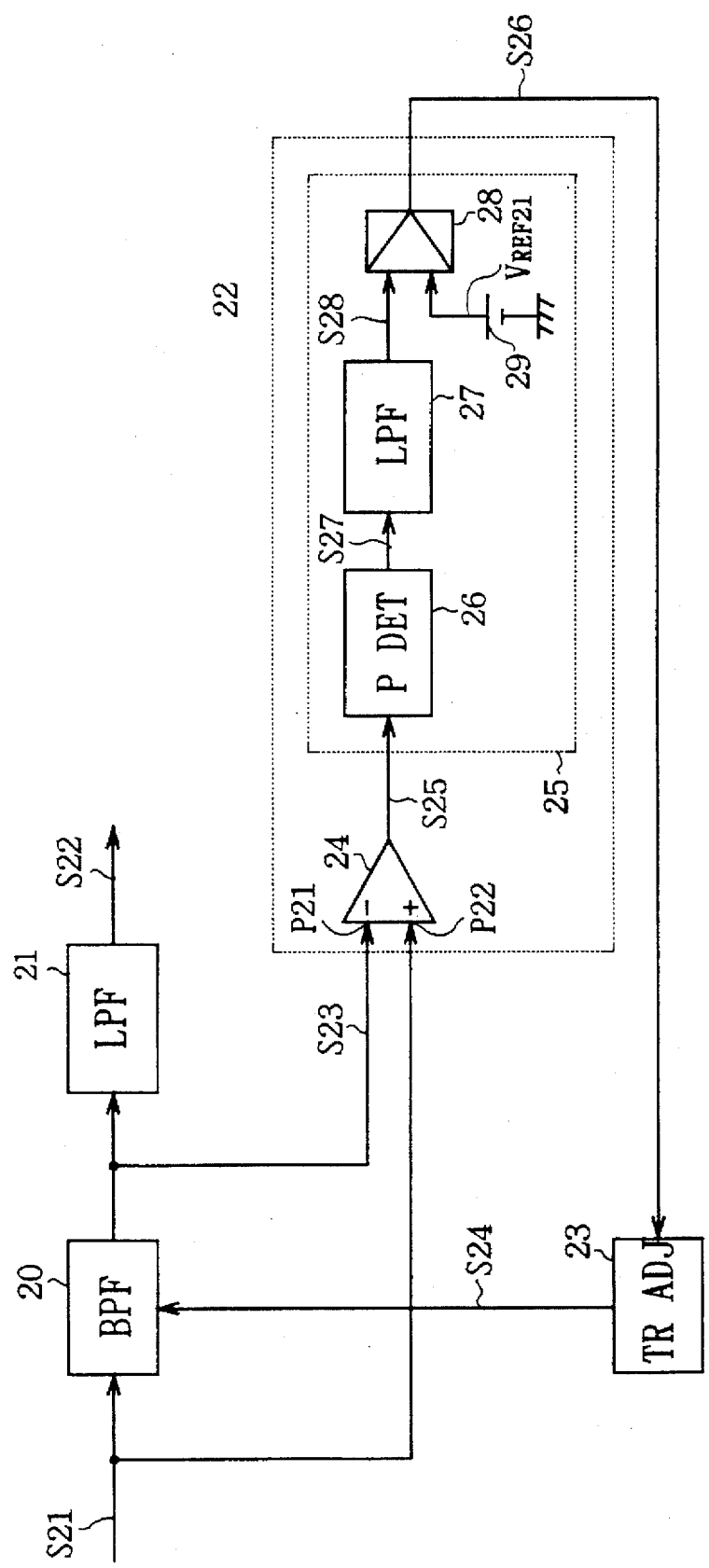
FIG. 7 is a block diagram showing the general construction of a second embodiment of the present invention.
Figure 8:
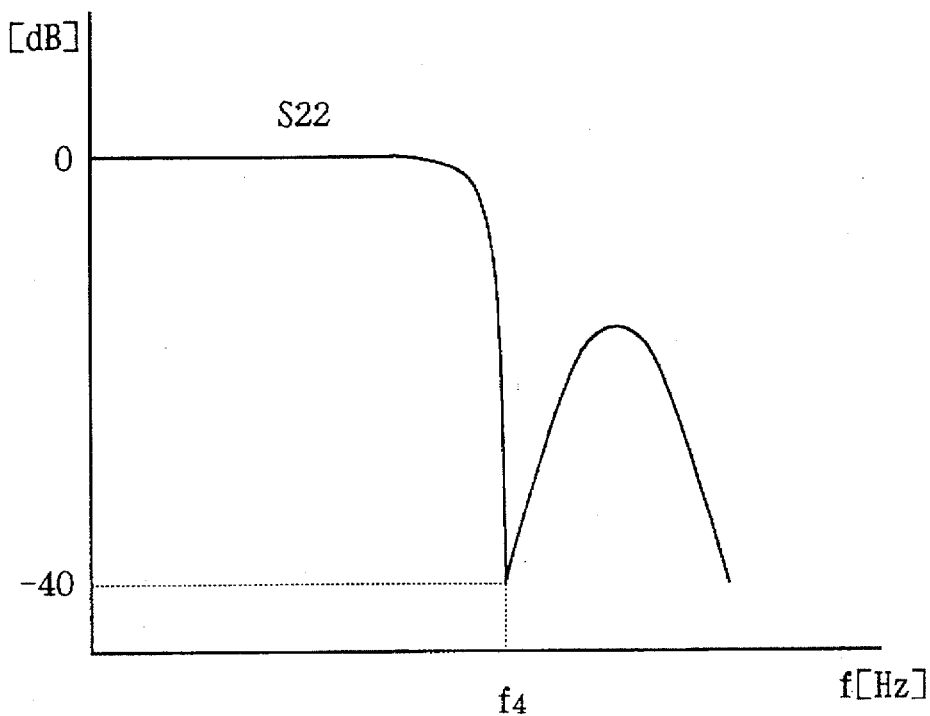
FIG. 8 is a characteristic curve linear diagram explaining the combined frequency characteristics of a filter adjusted in the second embodiment.

In FIG. 7, a band-pass filter 20 to be adjusted and a low-pass filter 21 which are connected in series to each other, together with a trap point detecting circuit 22, are contained in an integrated circuit. The frequency characteristic curve of the thus series-connected filter is as shown in FIG. 8. In this characteristic curve, a trap point which is attenuated to −40 [dB] at frequency $f_4$ is formed. When the input signal S21 is input, an output signal S22 which is attenuated in accordance with this frequency characteristic curve is output to the next stage from the low-pass filter 21 which is connected to the latter stage thereof.

Figure 9:
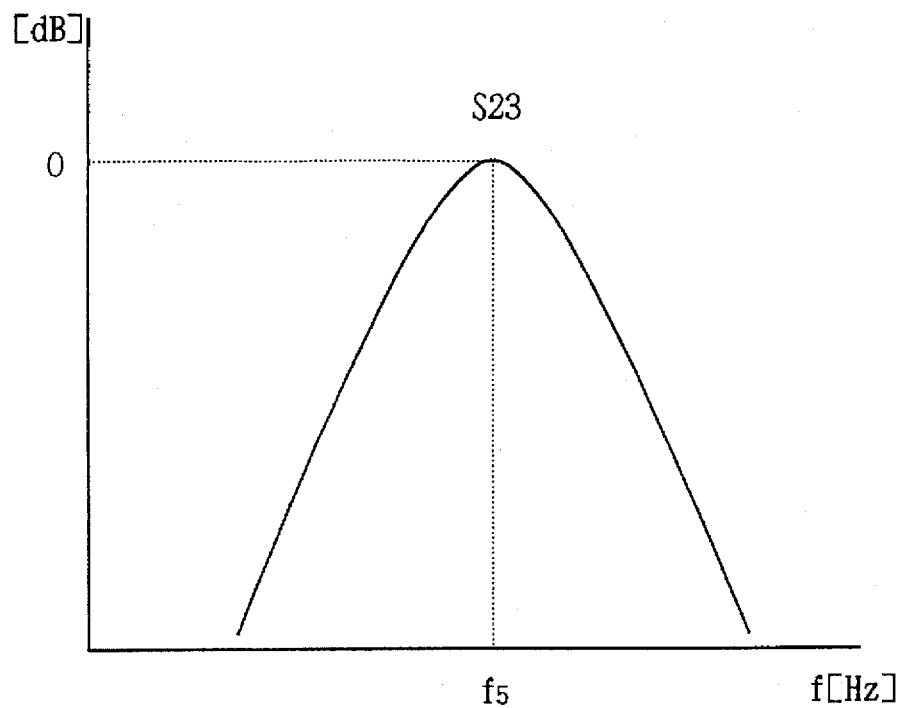
FIG. 9 is a characteristic curve linear diagram explaining the frequency characteristics of a band-pass filter from among filters to be adjusted in the second embodiment.

In the band-pass filter 20, a peak point of 0 [dB] is formed at frequency $f_5$ as shown in FIG. 9. An output signal S23 which is attenuated in accordance with this frequency characteristic curve is output to the low-pass filter 21 and the trap point detecting circuit 22. The band-pass filter 20 also adjusts the value of the current of the current source in accordance with an adjustment signal S24 supplied from a trap characteristic adjusting circuit 23, the frequency $f_5$ of the peak point is adjusted, and according to this adjustment of the frequency $f_5$, the frequency $f_4$ of the trap point is adjusted.

Figure 10:
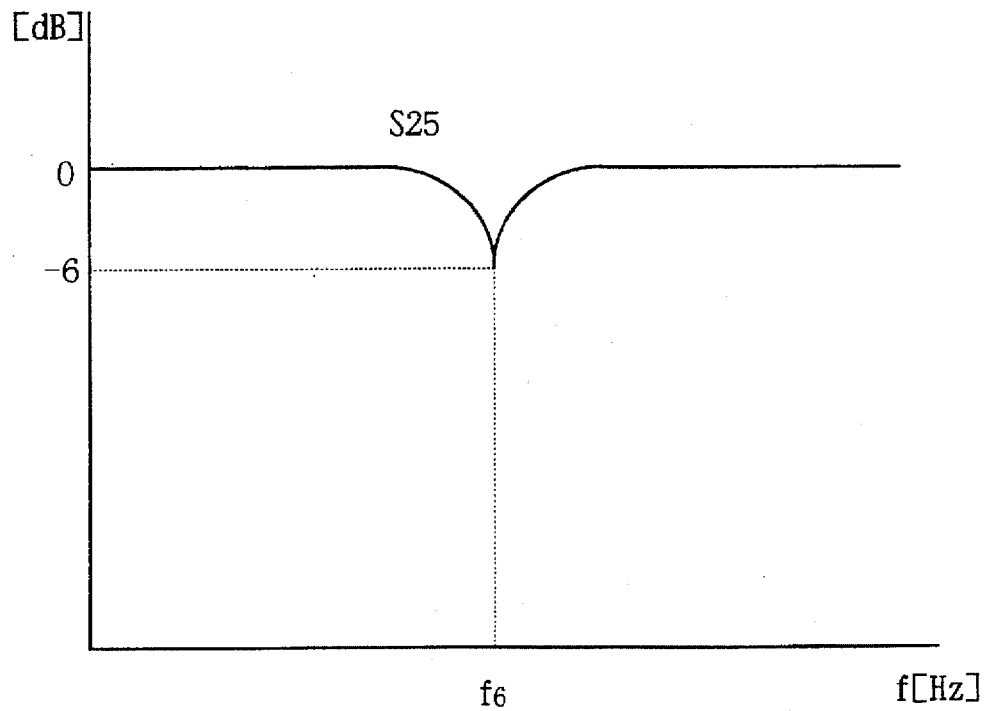
FIG. 10 is a characteristic curve linear diagram explaining the frequency characteristics of a computation signal in the second embodiment.

The trap point detecting circuit 22, when the input signal S21 and the output signal S23 are input to the subtracter 24, generates a computation signal S25 on the basis of the difference of the input signal S21 and the output signal S23, and then by the computation signal a trap point of −6 [dB] at frequency $f_6$ is formed in the frequency characteristic curve as shown in FIG. 10.

By adjusting the frequency $f_6$ of the computation signal S25 at the trap point adjusting to a desired frequency, when the amplitude of the computation signal S25 becomes smaller than a predetermined threshold value, the logic "H" level comparison signal S26 is supplied to the trap characteristic adjusting circuit 23, so that the adjustment is stopped and the frequency $f_4$ at the filter trap point of the combined filter formed of the band-pass filter 20 and the low-pass filter 21 can be set at a desired frequency.

The configuration of a trap point detecting circuit 22 will be described below. The trap point detecting circuit 22 is consisted of a subtracter 24 and a comparison circuit section 25. The input signal S21 is set previously to a predetermined frequency and a predetermined amplitude, and input to the band-pass filter 20 and a non-inversion input terminal P22 of the subtracter 24. The output signal S23 of the band-pass filter 20 is also input to an inversion input terminal P21 of the subtracter 24. In the subtracter 24, the output signal S23 is subtracted from the input signal S21, and amplified by an amplification factor of 10 times or less, and the computation signal S25 is generated such that the amplitude at the predetermined frequency is attenuated in accordance with the frequency characteristic curve of FIG. 10. Then, the subtracter 24 outputs the computation signal S25 to the comparison circuit section 25.

Thus, the band-pass filter 20 and the subtracter 24 operate as a band elimination filter for outputting the computation signal S25 which has converted the frequency characteristic formed a peak point in the band-pass filter 20, into frequency characteristic formed a shallow trap point.

When the frequency $f_5$ of the peak point is adjusted by the trap characteristics adjusting circuit 23, since the output of the band elimination filter consisted of the band-pass filter 20 and the subtracter 24 (i.e., the computation signal 251) is the result of the computation of the input signal S21 and the output signal S23, a frequency $f_6$ at the trap point is adjusted in the same direction as the adjustment in accordance with the adjustment of the frequency $f_5$ at the peak point.

As a result, the adjustment the frequency $f_6$ at the peak point becomes equivalent to the adjustment of the frequency $f_5$ at the peak point. Therefore, the adjustment of the frequency $f_6$ at the peak point becomes equivalent to the adjustment of the frequency $f_4$ at the peak point. Here, the trap frequency $f_6$ is adjusted to 9.8 [KHz], and the peak frequency $f_5$ is adjusted to 15.75 [KHz], so that the trap frequency 4 is adjusted to 23 [KHz].

The circuit configuration of the comparison circuit section 25 well be described. The comparison circuit section 25 inputs the computation signal S25 to a peak detecting circuit 26, measures the amplitude of the computation signal S25 to detect the minimum voltage, supplies the peak signal S27 indicating the minimum voltage to a low-pass filter 27 to remove the ripple components, and inputs it to a comparator 28 as a shaped peak signal S28.

The comparator 28 outputs the logic "H" level comparison signal S26 when the voltage of the shaped peak signal S28 is lower than the reference voltage $V_{REF21}$ of a reference voltage source 29. When, however, the voltage of the shaped peak signal S28 is higher than the reference voltage $V_{REF21}$, the comparator 28 outputs the logic "L" level comparison signal S26.

The trap characteristic adjusting circuit 23 is provided with a logic circuit for inputting the comparison signal S26, and supplies the adjustment signal S24 to the band-pass filter 20 in accordance with a predetermined sequence. When the logic "H" level comparison signal S26 is input, the adjustment is terminated.

Figure 11:
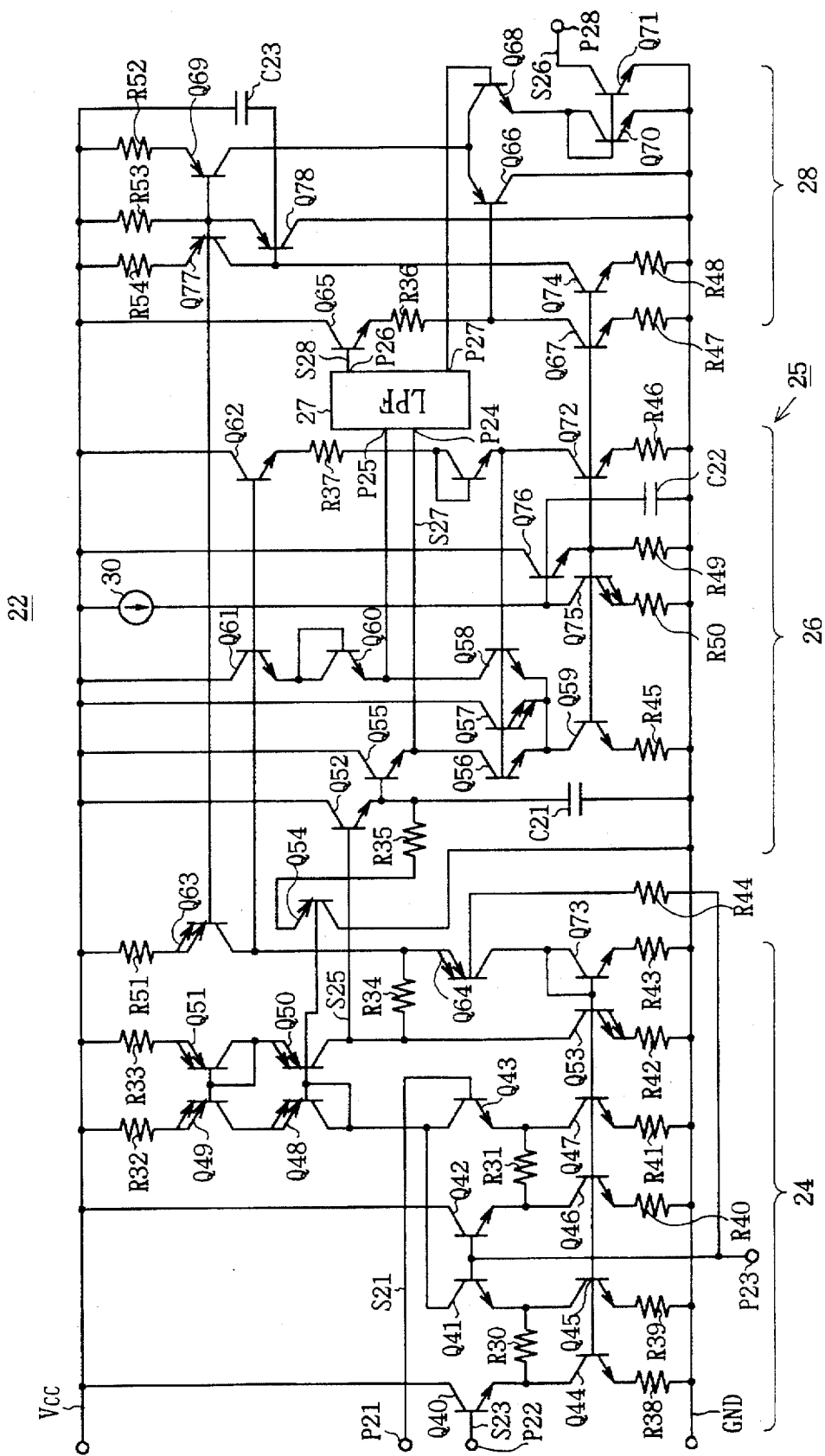
FIG. 11 is a schematic diagram explaining the trap point detecting circuit in the second embodiment.

Next, an example of circuit of the trap point detecting circuit 22 will be described. In FIG. 11, transistors Q40 and Q41 constitute one of the differential pair of the subtracter 24, and transistors Q42 and Q43 constitute the other differential pair. The emitters constituting one differential pair of the transistors Q40 and Q41 are connected to each other via a resistor R30 for expanding the dynamic range, and the collectors thereof are connected to the collectors of the transistors Q44 and Q45 constituting the current source, respectively.

The base of the transistor Q40 is connected to an input terminal P22, and the collector thereof is connected to the power supply voltage Vcc. The base of the transistor Q41 is connected to the base of the transistor Q42 and a bias input terminal P23 so as to be supplied with a predetermined constant voltage, and the collector thereof is connected to the collector of a transistor Q43.

Here, the output signal S23 is supplied from the band-pass filter 20 to the input terminal P21, the output signal S23 is converted into a current and amplified by the transistors Q40 and Q41 constituting the differential pairs, respectively. The collector current of the transistor Q41 becomes a current having a phase reverse to that of the output signal S23, this current being loaded to the collector of the transistor Q43.

The emitters of the transistors Q42 and Q43 constituting the other differential pairs are also connected to each other via a resistor R31 for expanding the dynamic range, the emitters being connected to the collectors of the transistors Q46 and Q47, respectively. The base of the transistor Q43 is connected to the input terminal P21. The collector of the transistor Q42 is connected to the power supply voltage Vcc. The collector of the transistor Q43 is connected to the collector of a transistor Q48 constituting the current mirror type current source.

Then, the input signal S21 is supplied from the input terminal P21 so as to be converted into current and amplified by the transistors Q42 and Q43 constituting the differential pairs, respectively. At this time, the phase of the collector current of the transistor Q43 becomes the phase same as that of the input signal S21. As a result, a current which is added together the current having the same phase as that of the input signal S21, and a current having a phase reverse to that of the output signal S23 loaded to the transistor Q41, flows through the collector of the transistor Q43.

The transistors Q48 to Q51 and resistors R32 and R33 constitute the current mirror type current source. The current the value of which is a same value as the current which flows through the collector of the transistor Q48, flows through the collector of the transistor Q50. The collector of the transistor Q50 is connected to the connection node of the base of a transistor Q52 constituting the peak detecting circuit 26 and a resistor R34, and to the collector of a transistor Q53 constituting the current source, and the base thereof is connected to the base of a transistor Q54.

As a result, the signal current that appears in the collector of the transistor Q48, or the signal current the same as the sum of the current having the same phase as that of the input signal S21 and the current having a phase reverse to that of the output signal S23, appears in the collector of the transistor Q50. At this time, since the signal current is supplied to one end of the resistor R34, a voltage used the bias voltage supplied to the other end of the resistor R34 as the center, is generated at the connection node of the transistor Q52 and the resistor R34, so as to be supplied to the base of the transistor Q52 as the computation signal S25. In this connection, the frequency characteristic which is converted into the computation signal S25 are same as shown in FIG. 10.

The collector of the transistor Q52 of the peak detecting circuit 26 is connected to the power supply voltage Vcc, and the emitter is connected to the base of a transistor Q55 and the ground line GND. The emitter of the transistor Q52 is also connected to one end of a resistor R35. The emitter of a transistor Q54 is connected to the other end of the resistor R35, and the collector is connected to the ground line GND, thus forming a limiter to limit the emitter voltage of the transistor Q52 which may rise more than necessary due to any reasons, for example, on turning on the power supply.

As a result, the amplitude of the computation signal S25 decreases and when its voltage is lower than that of the capacitor C21, the transistor Q52 is reversely biased so as to be turned off by the voltage of the capacitor C21, thereby allowing not to charge the capacitor C21. At this time, the charge stored in the capacitor C21 is discharged as the base current of a transistor Q55, and the voltage of the capacitor C22 lowers at a predetermined speed. When, however, the amplitude of the computation signal S25 increases and its voltage is higher than that of the capacitor C21, the transistor Q52 turns on to flow the current, so as to charge the capacitor C21 at the voltage at that time.

An output buffer circuit of the transistor Q52, is composed of the transistor Q55 the collector of which is connected to the power supply voltage Vcc, and the emitter thereof is connected to the collector of a transistor Q56 of the current source and an input terminal P24 of the low-pass filter 27. The common emitter of transistors Q56, Q57, and Q58 constituting the current source is connected to the collector of a transistor Q59 of the current source. The common base of the transistors Q56, Q57, and Q58 is also connected to the emitter of a transistor Q60, the transistors Q56, Q57, and Q58 being supplied with a predetermined bias voltage.

As a result, the voltage of the capacitor C21 is converted into a current and amplified by the transistor Q55 to become the peak signal S27 and supplied to the input terminal P24 of the low-pass filter 27.

The emitter of a diode-connected transistor Q60 is connected to the collector of the transistor Q58 and an input terminal P25 of the low-pass filter 27, and the collector thereof is connected to the emitter of a transistor Q61 constituting the current source. The collector of the transistor Q61 is also connected to the power supply voltage Vcc, and the base thereof is connected to the base of a transistor Q62 constituting the current source and the other end of a resistor R34. The other end of the resistor R34 is connected to the collector of a transistor Q63 constituting the current source and to the emitter of a transistor Q64 constituting the current source.

As a result, the predetermined voltage is supplied to the input terminal P25 of the low-pass filter 27 from the connection node of the collector of the transistor Q58 and the emitter of the transistor Q60.

The base of a transistor Q65 is connected to an output terminal P26 of the low-pass filter 27, and the collector thereof is connected to the power supply voltage Vcc. The emitter of the transistor Q65 is connected to one end of a resistor R36. The other end of the resistor R36 is connected to the base of a transistor Q66 and the collector of a transistor Q67.

As a result, the low-pass filter 27 removes a ripple of the peak signal S27, which is supplied to the base of the transistor Q65 from the input terminal P26 so as to be converted into current, amplified by the transistor Q65 up to the level of the current shifted by the resistor R36, and then supplied to the base of the transistor Q66.

The transistors Q66 and Q68 constitute the differential pair of the comparator 28. In these, the emitter of the transistor Q66 is connected to the emitter of the transistor Q68 and the collector of a transistor Q69 constituting the current source, and the collector is connected to the ground line GND. On the other hand, the base of the transistor Q68 is connected to an input terminal P27 of the low-pass filter 27, and the collector thereof is connected to the collector of a transistor Q70 constituting the current source.

Then, the base of the transistor Q68 is supplied with a voltage from an output terminal P27 of the low-pass filter 27, corresponding to the reference voltage $V_{REF31}$ of FIG. 7. A shaped peak signal S28 is turned on when the voltage whose level has been shifted through the resistor R36 is higher than the base voltage of the transistor Q68. When, however, the voltage whose level has been shifted through the resistor R36 is higher than the base voltage of the transistor Q68, the shaped peak signal S28 is turned off.

A base of a diode-connected transistor Q70 is connected, together with a transistor Q71, thereby constituting a current mirror type current source. That is, the base of the transistor Q70 is connected to the base of the transistor Q71, and the emitter thereof is connected to the ground line GND. The collector of the transistor Q71 is connected to an output terminal P28, and the emitter thereof is connected to the ground line GND.

As a result, the transistors Q70 and Q71 are turned on when the transistor Q68 is turned on to flow the current, and output the logic "L" level comparison signal S26 from the output terminal P28. When, however, the transistor Q68 is turned off and the current does not flow, they output the logic "H" level comparison signal S26 from the output terminal P28.

In the above-described construction, the general operation will be described with accompanying FIGS. 7 and 11. The frequency and the amplitude of the input signal S28 and the reference voltage $V_{REF21}$ of the comparator 28 are determined beforehand so that the shaped peak signal S28 is attenuated when the frequency characteristic of the combined filter formed of the band-pass filter 20 and the low-pass filter 21 reach the desired characteristic, and the comparator 28 outputs from the output terminal P28 the comparison signal S26 which rises to the logic "H" level.

When the input signal S21 is input to the input terminal P21 of the subtracter 24 and the output signal S23 is input to the input terminal P22, the input signal S21 and the output signal S23 are converted into a current and amplified. Then, the difference of the current between the input signal S21 and the output signal S23 appears in the collector of the transistor Q43, and this current difference which is the same as the above appears in the collector of the transistor Q50 of the current mirror type current source. This current difference is converted into a voltage by a resistor R34 again to become the computation signal S25 and is supplied to the transistor Q52 of the peak detecting circuit 26.

The amplitude of the computation signal S25 is not sufficiently attenuated by the output signal S23 when the set value of the adjustment is not a desired one, but the more the trap characteristic adjusting circuit 23 adjusts the band-pass filter 20 toward a target frequency, the more the amplitude decreases. That is, the more the combined filter formed of the band-pass filter 20 and the low-pass filter 21 is adjusted toward the target frequency, the more the amplitude decreases. Therefore, the base of the transistor Q52 of the peak detecting circuit 26, which is supplied with the computation signal S25 that gradually decreases, is reversely biased by the electrical potential of the capacitor C21, and does not charge the capacitor C21.

In this manner, when stopping the charge of the capacitor C21, a transistor Q55 discharges a charge of the capacitor C21 as the base current at a predetermined speed and its electric potential lowers. At this time, the electric potential of the peak signal S27 which has been converted again into a current by the transistor Q55 also lowers, and the shaped peak signal S28 the voltage of which is lower than the above electrical potential is supplied to the base of the transistor Q65 of the low-pass filter 27.

When in due time the amplitude of the low-pass filter 21 reaches the predetermined voltage or less, the transistor Q66 is turned on, the transistor Q68 is turned off, and the transistors Q70 and Q71 are turned off. As a result, the logic "H" level comparison signal S26 is supplied to the trap characteristics adjusting circuit 23 from the output terminal P28 to stop adjusting, and the frequency $f_4$ of the combined filter formed of the band-pass filter 20 and the low-pass filter 21 is set at a desired frequency.

With such an arrangement, since the trap point of the computation signal S25 is detected which has been converted so that the output amplitude can be set at a large amplitude on completing the adjustment, instead of an output signal S22 whose output amplitude is small on completing the adjustment, it is possible to set the amplification factor of the subtracter 24 considerably low. Therefore, since the offset error of the subtracter 24 is considerably small enough to be ignored, it is possible to reduce influences by variations in the characteristics of the elements of the comparison circuit section 25.

Since the offset error of the subtracter 24 is considerably small, it is possible to form the low-pass filter 27 by using a small number of elements. In addition, since the amplitude of the trap point of the computation signal S25 when the adjustment is completed is considerably larger than that of the trap point of the output signal S22, it is possible to easily set the threshold value of the comparator 28.

Although the above-described embodiments has been described of a case in which the frequency of the input signal is specified at one frequency and a determination of whether the adjustment has been properly performed or not made by using the comparison circuit section, this invention is not only limited to such a case. For example, the input signal may be white noise and the frequency of the peak point or the frequency of the trap point may be detected by monitoring the frequency of an output signal and the distribution of the intensity on a display screen or the like.

Although the above-described embodiments has been described a case in which the logic "H" level or logic "L" level comparison signal is supplied to the trap characteristic adjusting circuit in order to complete the adjustment, this invention is not only limited to this case. For example, adjusting means may be notified by a light-emitting diode or the like to complete the adjustment.

Although the above-described embodiments has been described of a case in which the adjustment is made by the trap characteristic adjusting circuit, this invention is not only limited to this case. For example, whether the adjustment has been properly performed or not is notified to an adjustment operator by using a light-emitting diode or the like and the adjustment operator may make a manual adjustment.

Although the above-described embodiment has been described of a case in which the input signal and the output signal are input to the trap point detecting circuit in order to adjust the combined filter formed of the band-pass filter and the low-pass filter has been described, this invention is not limited to this case. For example, the input signal and the output signal may be input to such a trap point detecting circuit that the frequency of the peak point is adjusted to adjust the combined filter formed of the band-pass filter and the low-pass filter.

In addition, although the above-described embodiment has been described of case in which the combined filter is formed of filters having two stages, this invention is not only limited to this case. For example, this invention may be used to adjust the characteristics of a combined filter by adjusting the characteristics of a filter at an arbitrary position at any of the stages of a combined filter formed of filters having three or more stages.

As has been described above, according to this invention, the amplification factor of characteristics converting means necessary for detecting a maximum or minimum value of a characteristics conversion signal is considerably small. Therefore, it is possible to considerably decrease an offset error of the characteristics converting means. It is possible to realize a filter adjusting circuit by using a small number of elements, which is not easily affected by variations in the characteristics of elements which form the detecting means and is capable of easily adjusting the frequency characteristics of the filter.

Third embodiment of this invention will be described below.

Figure 12:
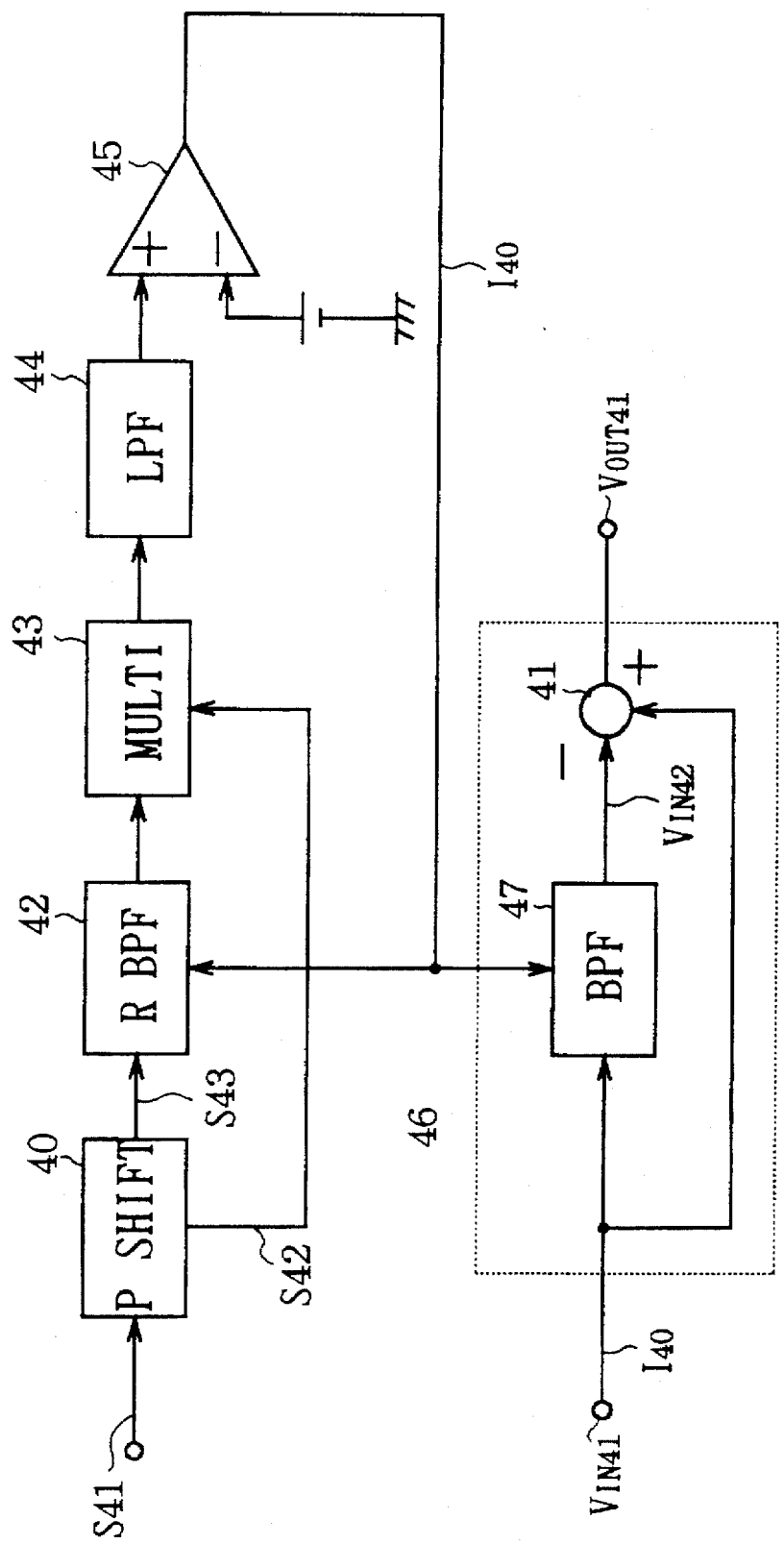
FIG. 12 is a block diagram showing a third embodiment of filter characteristic auto-adjusting circuit in a video signal processing circuit of this invention.

FIG. 12 is a block diagram illustrating an embodiment of an automatic filter character adjusting circuit in a video signal processing IC in accordance with this invention.

In FIG. 12, 40 denotes a 90° phase shifter; 42 denotes a reference filter (hereinafter referred to as "reference BPF") formed of a BPF; 43 denotes a multiplier; 44 denotes an LPF; 45 denotes a V/I converter; and 46 denotes an adjustable filter.

An adjustable filter 46 is composed of a BPF 47 connected to an input line of the adjustment current $I_{40}$, the BPF 47 being the same as a reference BPF 42, and a computation circuit 41 for subtracting a signal $V_{IN42}$ which is passed through the BPF 47 from an input signal $V_{IN41}$. The adjustable filter 46 is formed of an $f_{SC}$ trap consisting of a (1-BPF) circuit in which the BPF 47 and the computation circuit 41 are combined.

In accordance with this trap, as described above, the reference filter for automatically adjusting $f_0$ is also formed of BPFs which are the same type of filters.

As a result, an $f_{SC}$ trap which achieves a completely stable $f_0$ with respect to various variation factors is realized.

An explanation will be given below of the reason why an $f_{SC}$ trap which achieves a stable $f_0$ can be realized when the $f_{SC}$ trap requiring the accuracy of $f_0$ is formed by a (1-BPF) circuit and an automatic adjusting circuit of $f_0$ uses the same BPF.

At present, a great number of filters are contained in a video signal processing IC. These filters are basically formed of a secondary bi-cut filter shown in FIG. 13.

Figure 13:
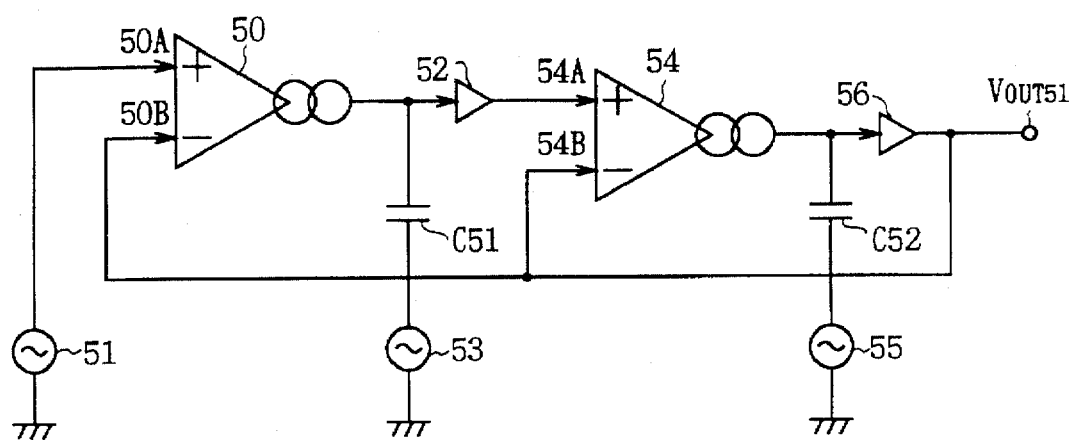
FIG. 13 is a schematic diagram showing a secondary bi-cut filter according to this invention.

The secondary bi-cut filter, as shown in FIG. 13, consists of V/I converters 50 and 54, capacitors C51 and C52, and signal sources 51, 53 and 55.

As for a specific connection, a non-inversion input terminal 50A of the amplifier 50 is connected to the signal source 51, and an inversion input terminal 50B of the amplifier 50 is connected to an inversion input terminal 54B of the amplifier 54 and the output of the amplifier 54.

The output of the amplifier 50 is connected to the signal source 53 via the capacitor C51 and to the non-inversion input 54A of the amplifier 54. The output of the amplifier 54 is connected to the signal source 55 via the capacitor C52.

In the secondary bi-cut filter constructed as described above, when inputs of signal sources 51, 53, and 55 are combined, various filters can be realized.

In one example of a filter, when a trap is formed, the same signal is input from the signal sources 51 and 55. When a BPF is formed, a signal may be input from the signal source 53. Their respective transmission functions are as follows:

$$V_{OUTS1(TRAP)} = (S^2+\omega_0^2)/[S^2+(\omega_0/Q) \cdot S+\omega_0^2] \cdot V_{IN41} \quad (1)$$

$$V_{OUTS1(BPF)} = [(\omega_0/Q) \cdot S]/[S^2+(\omega_0/Q) \cdot S+\omega_0^2] \cdot V_{IN41} \quad (2)$$

where $$\omega_0 = (g_{m50} \cdot g_{m54})/(C_{51} \cdot C_{52})^{1/2} \quad (3)$$

$$Q = (C_{52} \cdot g_{m50})/(C_{51} \cdot g_{m54})^{1/2} \quad (4)$$

Thereby, as regards the circuitry of (1-BPF) of the adjustable filter 46 of FIG. 12, its transmission function is as shown by the following equation:

$$1-V_{(BPF)} = (S^2+\omega_0^2)/[S^2+(\omega_0/Q) \cdot S+\omega_0^2] \cdot V_{IN41} \quad (5)$$

That is, the transmission function of the circuitry of (1-BPF) of the adjustable filter 46 becomes the same as that of the trap shown by the above-described equation (1).

Therefore, an $f_{SC}$ trap which achieves a stable $f_0$ can be realized when the $f_{SC}$ trap requiring the accuracy of $f_0$ is formed by a (1-BPF) circuit and an automatic adjusting circuit of $f_0$ uses the same BPF.

Next, the operation based on the above-described construction will be explained.

The reference signal S41 of a frequency $f_{SC}$, the signal of which serves as a reference for automatic adjustment and is generated by an unillustrated reference oscillator or the like, is input to the 90° phase shifter 40.

In the 90° phase shifter 40, two types of signals S42 and S43 are obtained from the reference signal S41.

The signal S42 whose phase is 0° is input to one of the input terminals of the multiplier 43.

On the other hand, the signal S43 whose phase is 90° is input to a reference BPF 42. A signal output from this reference BPF 42 is input to the other terminal of the multiplier 43.

In the multiplier 43, the two input signals are multiplied to compare the phases of the two signals. A resultant phase error is output to the LPF 44.

In the LPF 44, high-order components of the input phase error are cut off. The signal whose high-order components are cut off is input to the V/I converter 45 where the signal is converted from voltage into current.

The current 140 obtained by the V/I converter 45 is fed back to the reference BPF 42, and controlled so that the output phase of the reference BPF 42 becomes 90° with respect to the reference signal S41.

That is, the frequency $f_0$ of the reference BPF 42 is adjusted to the same accuracy as that of the reference signal S41, and $f_0$ of the adjustable filter 46 is also adjusted stably with respect to various factors which cause $f_0$ to vary.

According to this embodiment, as described above, an $f_{SC}$ trap circuit requiring the accuracy of $f_0$ in an active filter having a video signal processing IC or the like contained therein is formed of (1-BPF) circuit for subtracting a signal $V_{IN41}$ which is passed through the BPF 47 on the basis of the input signal $V_{IN41}$, and in the (1-BPF) circuit, the BPF 47 and the computation circuit 41 are combined. Further, the reference filter 42 of an automatic adjusting circuit of $f_0$ is formed of the same type BPF as the BPF 47 formed of the $f_{SC}$ trap circuit. Thereby, an $f_{SC}$ trap circuit which is almost completely stable with respect to various factors which cause $f_0$ to vary can be realized.

Actually, by forming this active filter, the accuracy of $f_0$ which has hitherto been approximately 3% could be made 1% or less. More particularly, the standard of chroma emphasis, requiring an $f_0$ accuracy of 0.5% in the 8-mm video signal processing format, could be satisfied satisfactorily, and a completely self-contained form could be realized.

Although in this embodiment an explanation has been given using an $f_{SC}$ trap as an example, the reference filter and the adjustable filter may be formed of the same type of filters. Then, both filters perform the same operation for various variation factors except when an $f_{SC}$ trap is not used. Thus, their $f_0$ can be adjusted with a high degree of accuracy.

Fourth embodiment of this invention will be described below.

Figure 14:
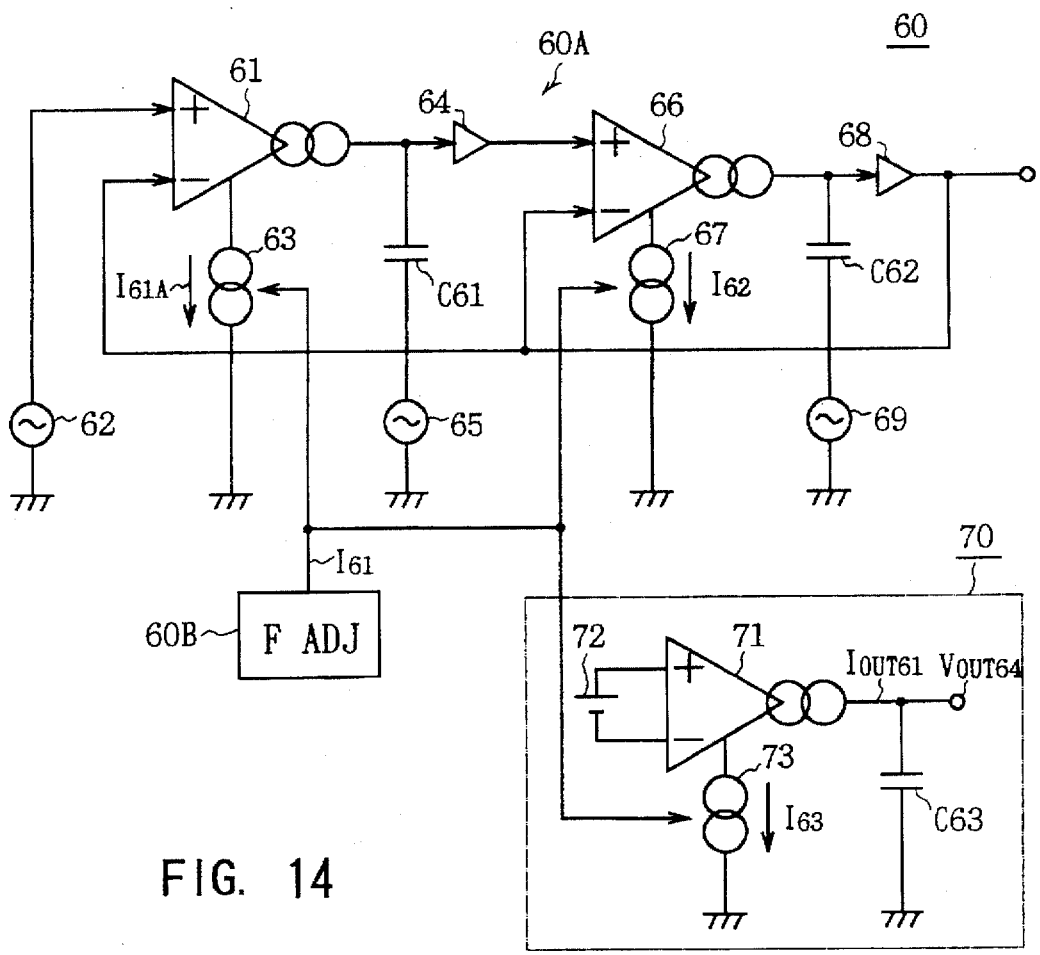
FIG. 14 is a schematic diagram showing the basic construction of a ramp waveform generating circuit using a reference current generating circuit in a fourth embodiment of video signal processing circuit according to this invention.

FIG. 14 is a block diagram illustrating the basic construction of a ramp waveform generating circuit. The ramp waveform generating circuit uses a reference current generating circuit in a video signal processing circuit in accordance with this invention.

In FIG. 14, 60 denotes an automatic filter characteristic adjusting circuit formed of, for example, a secondary bi-cut filter 60A working as a BPF and an $f_0$ adjustment system 60B of the filter.

70 denotes a ramp waveform generating circuit formed of the V/I converter 71, the constant voltage source 72, and the capacitor C63.

The secondary bi-cut filter 60A has the same construction as that explained with reference to FIG. 13, but the V/I converters 61 and 66 of the secondary bi-cut filter 60A, and the V/I converter 71 of the ramp waveform generating circuit 70 are formed of Gilbert amplifiers. The current of the Gilbert amplifiers is controlled by the adjustment current $I_{63}$ in order to adjust variations (variations in capacity and V/I converters) at $f_0$ of the secondary bi-cut filter 61.

In this circuit, the V/I converter 71 is formed of the Gilbert amplifier controlling the current by using the adjustment current $I_{63}$ obtained by the automatic filter characteristic adjusting circuit, so that a reference current generating circuit which generates a reference current proportional to the capacity variation within the IC is formed. The capacitor C63 is connected to the output of the V/I converter 71, so that the ramp waveform generating circuit 70 is formed.

An explanation will now be given of the reason why a reference current proportional to the capacity variation within the IC can be generated when the current of a Gilbert amplifier formed of the V/I converter 71 is controlled by using the adjustment current $I_{63}$ obtained by the automatic filter characteristics adjusting circuit.

Figure 15:
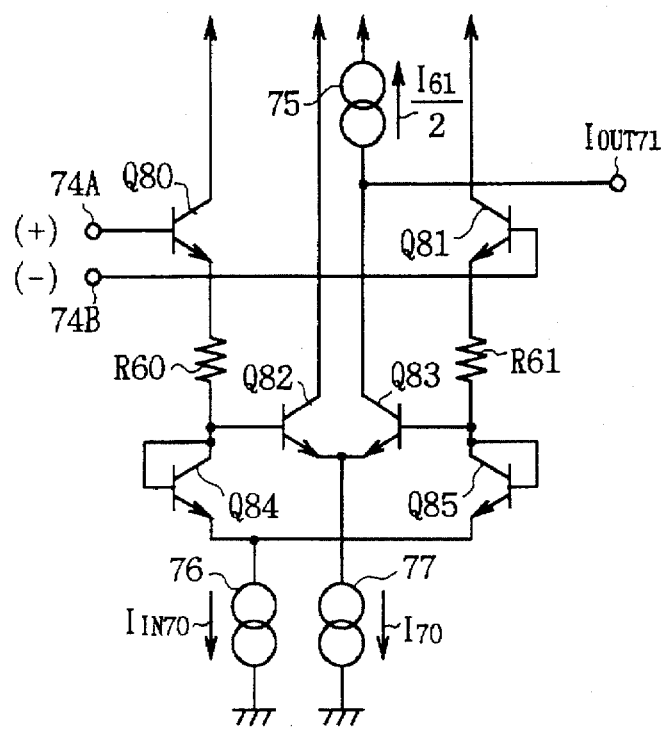
FIG. 15 is a schematic diagram illustrating Gilbert amplifiers of this invention.

FIG. 15 is a circuit diagram illustrating Gilbert amplifiers used as the V/I converters 61, 66, and 71.

In FIG. 15, Q80 to Q85 denote npn type transistors; 75 to 77 denote current sources; and R60 and R61 denote resistor elements. These elements are connected as described below.

That is, the base of the transistor Q80 is connected to an input terminal 74A, the collector is connected to the power-supply voltage, and the emitter is connected to one terminal of the resistor element R60.

The base of the transistor Q81 is connected to an input terminal 74B, the collector is connected to the power-supply voltage, and the emitter is connected to one terminal of the resistor element R61.

The base of the transistor Q82 is connected to the other terminal of the resistor element R60 and to the collector of the transistor Q84; the collector is connected to the power-supply voltage; and the emitter is connected to the emitter of the transistor Q83, the connection node of these emitters being connected to the current source 77.

The base of the transistor Q83 is connected to the other terminal of the resistor element R61 and to the collector of the transistor Q85; and the collector is connected to the current source 74.

In the transistor Q84, the base thereof is connected to the collector thereof. The emitter thereof is connected to the emitter of the transistor Q85, the connection node of these emitters being connected to the current source 76. The base of the transistor Q85 is connected to the collector thereof.

The input stage of the Gilbert amplifier consists of transistors Q80, Q81, Q84, and Q85, and the output stage consists of transistors Q82 and Q83. An output current $I_{OUT71}$ is output from the connection node of the collector of the transistor Q83 and the current source 75.

The transconductance of the Gilbert amplifier is as shown by the following equation:

$$g_m = (I_{70})/[2(R_E + 2r_e) \cdot I_{IN70}] \tag{6}$$

Here, if the capacities of the capacitors C61 and C62 of the secondary bi-cut filter 60A of FIG. 14 are denoted as "C", the adjustment current $I_{70}$ is expressed by the following equation:

$$I_{70} = 2(R_E + 2r_e) \cdot I_{IN70} \cdot C \cdot \omega_0 \tag{7}$$

Therefore, $g_m$ of the V/I converter 71 of the ramp waveform generating circuit 70 is expressed by the following equation:

$$g_{m71} = [2(R_E + 2r_e) \cdot I_{IN70} \cdot C \cdot \omega_0]/[2(R_E + 2r_e) \cdot I_{IN70}] = C \cdot \omega_0 \tag{8}$$

With respect to the input of the V/I converter 71, when a voltage V is supplied from the constant voltage source 72, the output current $I_{OUT71}$ is as shown by the following equation:

$$I_{OUT71} = C \cdot \omega_0 \cdot V \tag{9}$$

Here, $\omega_0$ is constant, because its variation is adjusted, and the voltage V is also constant. Therefore, the output current $I_{OUT71}$ becomes a current proportional to the variation of the capacity value C.

The output voltage $V_{OUT71}$ of the ramp waveform generating circuit 70 can be given by the following equation when the capacity of the capacitor C63 is denoted as $C_{63a}$.

$$V_{OUT61} = (I_{OUT61} \cdot \tau)/C_{63a} \tag{10}$$

The time $\tau$ can be obtained from the above equation (10) as follows:

$$\tau = (C_{63a} \cdot V_{OUT61})/I_{OUT61} \tag{11}$$

Since the output current $I_{OUT61}$ is a current proportional to the capacity value C on the basis of the above-described equation (9), the time $\tau$ is not affected by the absolute variation in the capacity.

As described above, since in this reference current generating circuit an adjustment current of the automatic filter adjusting circuit is used as the current source of a Gilbert amplifier, a current proportional to the absolute variation in the capacity can be generated. Not only the capacity variation can be canceled, but also temperature characteristics can be canceled. In addition, since it is possible to form the reference current generating circuit by using only the inside of the IC, it is possible to reduce the number of IC terminals and externally provided parts, and to realize a circuit with high precision by using a small number of elements.

It is possible to obtain an arbitrary time $\tau$ with a small absolute variation by using the reference current generating circuit.

According to the automatic filter adjusting circuit of this invention, as described above, it is possible to adjust $f_0$ of the filter with a high degree of accuracy, and to achieve an $f_{SC}$ trap almost completely stable with respect to various variation factors for $f_0$.

According to the reference current generating circuit of this invention, it is possible to generate a current proportional to the absolute variation in the capacity. Not only the capacity variation can be canceled, but also temperature characteristics can be canceled. In addition, since only the inside of the IC is required to form the reference current generating circuit, it is possible to reduce the number of IC terminals and externally provided parts, and to realize a circuit with high precision by using a small number of elements.

Fifth embodiment of this invention will be described below.

Figure 16:
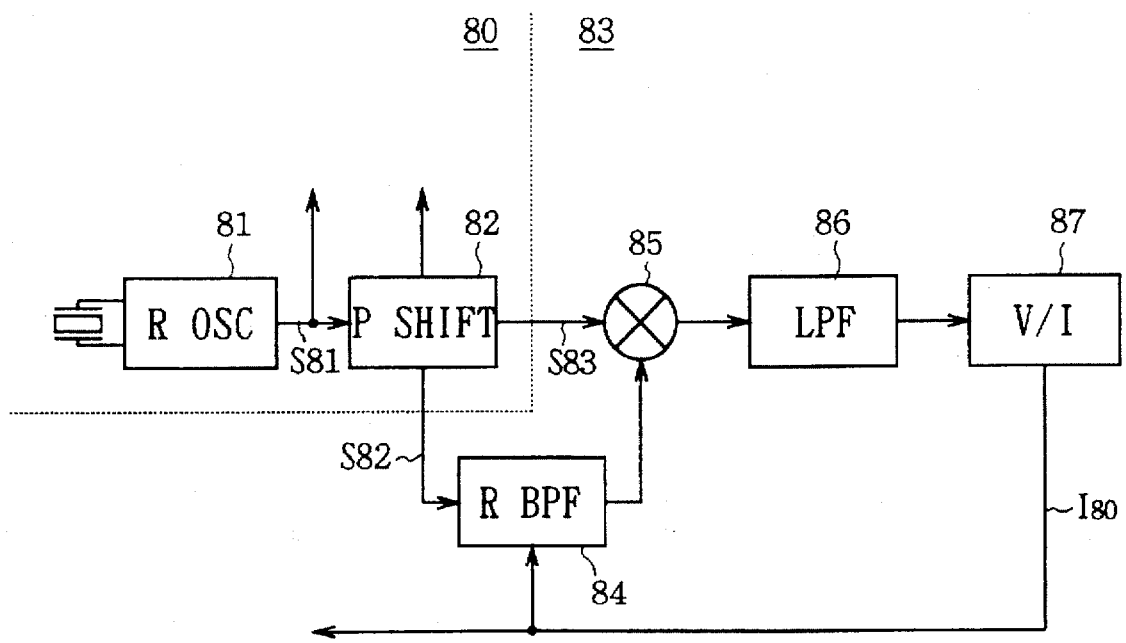
FIG. 16 is a block diagram showing an embodiment of a filter characteristic auto-adjusting circuit in a fifth embodiment of video signal processing circuit of this invention.

FIG. 16 is a block diagram showing an embodiment of an automatic filter adjusting circuit in a video signal processing circuit according to this invention.

Referring to FIG. 16, 80 indicates a video signal processing section and 83 indicates an automatic filter adjusting section.

The video signal processing section 80 is disposed on a video signal processing IC and consists of a reference oscillator 81 having a crystal oscillator and which is used for chroma signal processing and is capable of changing frequency, and a 90° phase shifter 82 which generates a signal shifted by 90° receiving an output signal from the reference oscillator 81.

The video signal processing section 80 carries out chroma signal processing by using a reference signal (for example, a color sub-carrier) of a frequency $f_{SC}$ generated by the reference oscillator 81 and a S83 which is obtained by shifting the phase of the reference signal S81 by 90° by the 90° phase shifter 82. The signals S82 and S83 which are shifted by 0° and 90°, respectively, by the 90° phase shifter 82 are output to the automatic filter adjusting section 83.

The automatic video adjusting section 83 has a reference BPF 84 into which the signal S82 having the phase of 0° which is output from the 90° phase shifter 82 of the video signal processing section 80, a multiplier which acts as a phase comparator in order to multiply an output signal of the reference BPF 84 by the signal S83 shifted by 90° in terms of the phase which is output from the 90° phase shifter 82 of the video signal processing section 80 is input, an LPF 86 which cuts components of high orders of a signal output from the multiplier 85, and a V/I converter 87 which converts the voltage level of a signal output from the LPF 86 and feeds back this current $I_{80}$ to the reference BPF 84.

The operation of the system having the configuration described above will be described below.

The reference signal S81 of the reference frequency $f_{SC}$ is generated by means of the reference oscillator 81 of the video signal processing section 80 and output to the chroma processing system (not shown) and the 90° phase shifter 82.

In the 90° phase shifter 82, two types of signals S82 and S83 having phases shifted by 0° and 90°, respectively, are obtained from the input reference signal S81, and the automatic filter adjusting section 83 and the signal S83 are output to the chroma processing section (not shown).

In the chroma signal processing system, a specified signal processing is performed according to the signals S82 and S83.

On the other hand, the signal S82 having the phase shifted by 0° which has been input into the automatic filter adjusting section 83 is input into the reference BPF 84. In this case, the phase under the frequency $f_0$ is 0°.

A signal output from the reference BPF 84 is input to an input terminal of the multiplier 85. The signal S83 having the phase shifted by 90° which is output from the 90° phase shifter 82 is input to another input terminal of the multiplier 85.

The multiplier 85 multiplies two input signals to compare the phases of both signals, and as a result, a phase error is output to the LPF 86.

In the LPF 86, the components of high orders of an input phase error are cut, and after the components of high order are cut, the signal is input into the V/I converter 87 in order to convert the voltage to a current.

The current $I_{80}$ obtained by the V/I converter 87 is fed back to the reference BPF 84 and the current is controlled so that the output phase of the reference BPF 84 is 90° relative to the reference signal S81.

Namely, this procedure means that the frequency $f_0$ of the reference BPF 84 has been adjusted to the same accuracy as the reference signal S81.

As described above, according to this invention, the reference oscillator 81 and the 90° phase shifter 82 which are mounted on a video signal processing IC and function as a chroma signal processing system are shared in an automatic filter adjusting circuit.

Thus, conventional automatic filter adjusting circuits comprise a reference oscillator, 90° phase converter, a reference BPF, a multiplier (phase comparator), and an LPF and V/I converter. Conventionally, the automatic filter adjusting circuit is structured as a block independent of other functions on the same IC, however in the circuit according to this invention, it is not necessary to structure the reference oscillator and the 90° phase converter as an indenpent block, thereby reducing the number of elements and consumption power and realizing a high performance circuit.

Although the reference filter is structured by means of the BPF in this embodiment, this invention is not restricted to this embodiment.

Even if the reference filter which is structured as shown in FIG. 16 is applied as, for example, a chroma emphasis BPF which has the most strict standard regarding a 8-mm video signal processing format, the other filter's $f_0$ can be controlled with a degree of high accuracy.

Sixth embodiment of this invention will be described below.

Figure 17:
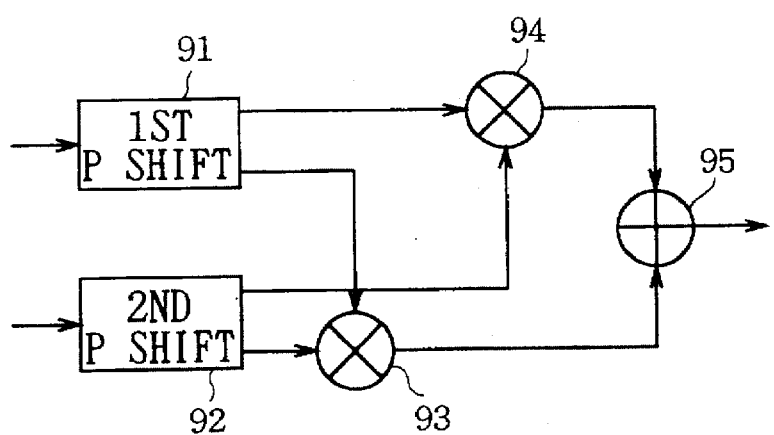
FIG. 17 is a block diagram showing the basic construction of a sixth embodiment of frequency converting circuit of this invention.

FIG. 17 shows a basic configuration of a frequency conversion circuit 90 in the video signal processing circuit according to this invention.

Referring to FIG. 17, a frequency conversion circuit 90 comprises a first 90° phase shifter 91, a second 90° phase shifter 92, a first multiplier 93, a second multiplier 94 and an adder 95.

The first 90° phase shifter 91 receives an input reference signal, for example, cos $(\omega_1 t)$, obtains two signals cos $(\omega_1 t)$ and sin $(\omega_1 t)$ which are different by 90° in terms of the phase and then outputs these signals to the first and second multipliers 93 and 94.

The second 90° phase shifter 92 receives an input signal to be converted, for example, cos $(\omega_2 t)$, and then outputs these signals to the first and second multipliers 93 and 94.

The first multiplier 93 multiplies the output signals cos $(\omega_1 t)$ of the first 90° phase shifter 91 by the output signal cos $(\omega_2 t)$ of the second 90° phase shifter 92 and outputs the result [cos $(\omega_2 t) \cdot$ cos $(\omega_1 t)$] to the adder 95.

The second multiplier 94 multiplies the output signal sin $(\omega_1 t)$ of the first 90° phase shifter 91 by the output signal sin $(\omega_2 t)$ of the second 90° phase shifter 92 and outputs the result [$\pm$sin $(\omega_2 t) \cdot$ cos $(\omega_1 t)$] to the adder 95.

The adder 95 adds an output of the first multiplier 93 and an output of the second multiplier 94 and outputs the result as an output signal of the frequency converter 90.

A result of the arithmetic operation of the adder 95 is as shown in the following equation:

$$\cos(\omega_2 t)\cdot\cos(\omega_1 t)\sin(\omega_2 t)\cdot\sin(\omega_1 t)=\cos(\omega_2\pm\omega_1)t \qquad (12)$$

Namely, the output signal of the frequency conversion circuit shown in FIG. 17 contains no side band which is unnecessary. Thus, no side band leak is caused.

This frequency conversion circuit can be structured by substituting the high accuracy reference oscillator 81 and the 90° phase shifter 82 which are disposed in the video signal processing IC, functioning as the chroma signal processing system, for the first 90° phase shifter 91 and the second 90° phase shifter 92 to share those in the same manner as in the automatic filter adjusting circuit described above.

Seventh embodiment of this invention will be described below.

Figure 18:
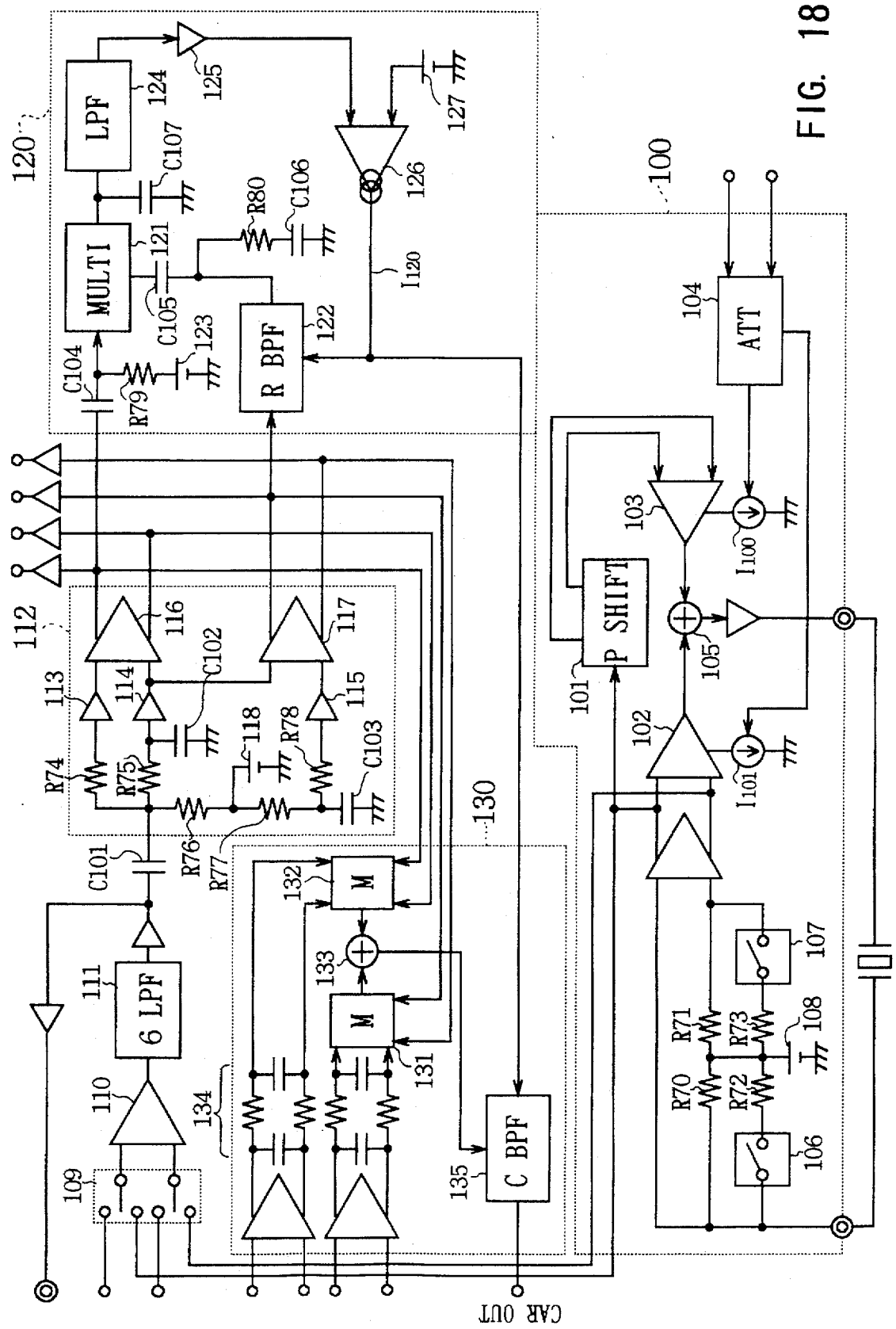
FIG. 18 is a schematic diagram showing an example of the construction of a video signal processing circuit which is provided with a seventh embodiment of the filter characteristic auto-adjusting circuit and the frequency converting circuit of this invention.

FIG. 18 is a circuit diagram showing an example of the construction of a video signal processing circuit which is equipped with both the automatic filter adjusting circuit and the frequency conversion circuit which share the high accuracy reference oscillator 81 which functions as the chroma signal processing system of the video signal processing section 80 and the 90° phase shifter 82 shown in FIG. 16.

As shown in FIG. 18, the reference oscillator 100 in the present circuit comprises a 90° phase shifter 101, limiters 102 and 103, attenuator 104, adder 105, resistances R70 to R73, switches 106 and 107, a voltage source 108, and current sources $I_{100}$ and $I_{101}$. The reference signal which has been set to a predetermined frequency is output as $F_{SC}$ to the chroma signal processing system (not shown) in the form of a sine wave through a changeover switch 109, a limiter 110 and a sixth LPF 111, and is input to the 90° phase shifter 112 through a capacitor C101.

The 90° phase shifter 112 consists of amplifiers 113 to 115, limiters 116 and 117, resistances R74 to R78, capacitors C102 and C103, and a voltage source 118. By delaying the phase of an input reference signal, the phase shifter 112 outputs two signals having phases shifted by 90° and 270° from the limiter 116, and outputs two signals having phases shifted by 0° and 180° from the limiter 117.

The four signals which are output from the limiters 116 and 117, having different phases by 90° each, are output to the chroma signal processing system (not shown). The signal having a phase shifted by 90° is input to the multiplier 121 of the automatic filter adjusting section 120 through a capacitor C104 and the signal having a phase shifted by 0° is input to a reference BPF 122.

The signals which are output from the limiter 116, having phases shifted by 90° and 270°, are input to the second multiplier 132 of the frequency conversion section 130 and the signals which are output from the limiter 117, having phases shifted by 0° and 180°, are input to the first multiplier 131 of the frequency conversion section.

When two signals having phases which are different by 90° are input, the operation of the automatic filter adjusting section on 120 is the same as in FIG. 16. Thus, the description of the operation is omitted.

Signals which are divided by a frequency divider at a predetermined dividing ratio are input to the first and second multipliers 131 and 132, respectively, of the frequency conversion section 130 through the LPF 134.

The results of the arithmetic operations of the first and second multipliers are added together by the adder 133 and input to the carrier BPF 135. The carrier BPF 135 is supplied with a feedback current by the V/I converter 126 of the automatic filter adjusting circuit 120 and the frequency $f_0$ is adjusted to the same accuracy as the reference signal.

An output from the carrier BPF 135 is designated as CAR OUT and is output to a processing circuit.

The video signal processing circuit shown in FIG. 18 is structured so that the conventional high accuracy VXO and the 90° phase shifter which are mounted on the video signal processing IC and are used for chroma signal processing, are shared by the automatic filter adjusting circuit and the frequency conversion circuit. Thus, it is possible to reduce the number of elements and consumption power, realizing a high performance circuit. Additionally, when chroma carrier conversion is performed by a SSB system, an accurate conversion circuit can be realized because an output signal from the high accuracy 90° phase shifter used for chroma signal processing is employed.

As described above, according to this invention, it is possible to reduce the number of elements and consumption power. When chroma carrier conversion is performed by the SSB system, an accurate conversion circuit can be realized by sharing the 90° phase shifter of the signal processing system.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A filter adjusting circuit, comprising:
   an input signal connected to a first adjustable filter;
   a trap frequency detector further comprising,
   a subtractor having a noninverting input connected to the input signal and an inverting input connected to an output from the first adjustable filter;
   an output from the subtractor connected to a peak detector input;
   an output from the peak detector connected to an input of a low-pass filter, said low-pass filter having an output connected to a first input of a comparator; and
   an output of the comparator connected to a trap frequency adjusting circuit for adjusting the first adjustable filter.

2. A filter adjusting circuit according to claim 1, wherein:
   said first adjustable filter is comprised of a band elimination filter.

3. A filter adjusting circuit according to claim 1, wherein:
   said first adjustable filter is comprised of a band-pass filter and a low-pass filter, connected in series with each other, said input signal being input to said band-pass filter and an output signal from the band-pass filter connected to an input of said low-pass filter and the inverting input of the subtractor.

* * * * *